US007897474B2

(12) United States Patent
Eto

(10) Patent No.: US 7,897,474 B2
(45) Date of Patent: Mar. 1, 2011

(54) METHOD OF FORMING SEMICONDUCTOR DEVICE INCLUDING CAPACITOR AND SEMICONDUCTOR DEVICE INCLUDING CAPACITOR

(75) Inventor: Toyonori Eto, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 12/326,993

(22) Filed: Dec. 3, 2008

(65) Prior Publication Data
US 2009/0146256 A1 Jun. 11, 2009

(30) Foreign Application Priority Data
Dec. 5, 2007 (JP) ............................... P2007-315050

(51) Int. Cl.
*H01L 21/00* (2006.01)
(52) U.S. Cl. .................... 438/396; 438/253; 438/256
(58) Field of Classification Search .................. 438/396, 438/253, 256
See application file for complete search history.

(56) References Cited

U.S. PATENT DOCUMENTS

| | | | | |
|---|---|---|---|---|
| 7,153,740 B2 * | 12/2006 | Kim et al. | ...................... | 438/253 |
| 7,332,395 B2 * | 2/2008 | Yokoi | ............................ | 438/253 |
| 7,767,565 B2 * | 8/2010 | Chung | ............................ | 438/585 |
| 2001/0044192 A1 * | 11/2001 | Takaishi | ........................ | 438/396 |
| 2002/0043681 A1 * | 4/2002 | Tsu et al. | ...................... | 257/301 |
| 2006/0197135 A1 * | 9/2006 | Inoue | ............................ | 257/306 |
| 2006/0211178 A1 * | 9/2006 | Kim et al. | ...................... | 438/129 |
| 2008/0277741 A1 * | 11/2008 | Cha | ................................ | 257/401 |
| 2009/0008743 A1 * | 1/2009 | Lee et al. | ...................... | 257/532 |
| 2009/0026541 A1 * | 1/2009 | Chung | ............................ | 257/347 |
| 2009/0108340 A1 * | 4/2009 | Seo | ................................ | 257/329 |
| 2009/0108341 A1 * | 4/2009 | Chung | ............................ | 257/329 |
| 2009/0146256 A1 * | 6/2009 | Eto | ................................ | 257/532 |
| 2009/0170275 A1 * | 7/2009 | Ban | ................................ | 438/421 |
| 2009/0242945 A1 * | 10/2009 | Cho et al. | ...................... | 257/288 |
| 2009/0242971 A1 * | 10/2009 | Cho et al. | ...................... | 257/328 |
| 2009/0250732 A1 * | 10/2009 | Kim | ................................ | 257/288 |
| 2009/0250748 A1 * | 10/2009 | Kim | ................................ | 257/329 |
| 2009/0258467 A1 * | 10/2009 | Kim | ................................ | 438/270 |
| 2010/0025758 A1 * | 2/2010 | Cho | ................................ | 257/329 |
| 2010/0120212 A1 * | 5/2010 | Yang et al. | .................... | 438/239 |

FOREIGN PATENT DOCUMENTS

| | | |
|---|---|---|
| JP | 11-317504 | 11/1999 |
| JP | 2005-229097 | 8/2005 |
| JP | 2006-135261 | 5/2006 |
| JP | 2006-245364 | 9/2006 |

* cited by examiner

*Primary Examiner* — Laura M Menz
(74) *Attorney, Agent, or Firm* — Young & Thompson

(57) ABSTRACT

A method of forming a semiconductor device may include, but is not limited to, the following processes. A second insulating film may be formed over a first insulating film. At least one through-hole may be formed, which penetrates the first and second insulating films. At least one first electrode may be formed, which extends at least along the side wall of the at least one through-hole. The first inter-layer insulator may be removed, while using the second insulating film as a temporary supporter that supports the at least one first electrode. At least one permanent supporter may be formed, which supports the at least one first electrode. The second insulating film as the temporary supporter may be removed, while leaving the at least one permanent supporter to support the at least one first electrode.

14 Claims, 11 Drawing Sheets

METHOD OF FORMING SEMICONDUCTOR DEVICE INCLUDING CAPACITOR AND SEMICONDUCTOR DEVICE INCLUDING CAPACITOR

BACKGROUND OF THE INVENTION

1. Field of the Invention

The present invention generally relates to a method of forming a semiconductor device and a semiconductor device. More specifically, the present invention relates to a method of forming a semiconductor device including a capacitor such as a crown capacitor and a semiconductor device including a capacitor such as a crown capacitor.

Priority is claimed on Japanese Patent Application No. 2007-315050, filed Dec. 5, 2007, the content of which is incorporated herein by reference.

2. Description of the Related Art

Dynamic random access memories (DRAMs) have an memory cell array that include memory cells. Each memory cell includes a switching transistor and a capacitor. There has been risen the problem with decreasing the capacitance due to shrinkage of the memory cell that can be realized by the advanced micro-processing technique.

For example. Japanese Unexamined Patent Application, First Publications, Nos. 11-317504, 2005-229097, 2006-135261, and 2006-245364 each address a semiconductor device including a crown capacitor and a method of forming the semiconductor device. The crown capacitor would be suitable to ensure the adequate capacitance with allowing shrinkage of the memory cell. Particularly, Japanese Unexamined Patent Application, First Publication, No. 2005-229097 discloses as follows. A cylinder hole is formed in a dummy oxide film. A bottom electrode is formed on the inside wall of the cylinder hole of the dummy oxide film. The bottom electrode has a bottom-closed cylinder shape. The dummy oxide film is removed, while the bottom electrode resides. It is necessary to prevent the bottom electrode from being collapsed. A supporter is provided to support the bottom electrode and to prevent the bottom electrode from being collapsed. In general, the dummy oxide film is removed by a wet etching process. The wet etching process is carried out using chemicals. The chemicals have a surface-tension that causes the formation of a short circuit between two adjacent bottom electrodes, thereby causing the defects of bit-pairs or bit-groups of the memory. The supporter is effective to prevent the formation of a short circuit between two adjacent bottom electrodes.

SUMMARY

In one embodiment a method of forming a semiconductor device may include, but is not limited to, the following processes. A second insulating film may be formed over a first insulating film. At least one through-hole may be formed, which penetrates the first and second insulating films. At least one first electrode may be formed, which extends at least along the side wall of the at least one through-hole. The first inter-layer insulator may be removed, while using the second insulating film as a temporary supporter that supports the at least one first electrode. At least one permanent supporter may be formed, which supports the at least one first electrode. The second insulating film as the temporary supporter may be removed, while leaving the at least one permanent supporter to support the at least one first electrode.

In another embodiment, a semiconductor device may include, but is not limited to, a plurality of first electrodes, and a first permanent supporter. The plurality of first electrodes may extend vertically. The first permanent supporter may extend horizontally and connects the plurality of first electrodes to each other, so that the first permanent supporter supports the plurality of first electrodes.

In still another embodiment, a semiconductor device may include, but is not limited to, a first electrode, a permanent supporter, a capacitive insulating film, and a second electrode. The first electrode may extend vertically. The permanent supporter may extend horizontally and may support the first electrode. The capacitive insulating film may cover both faces of the first, electrode and may further cover the permanent supporter. The second electrode may be disposed on the capacitive insulating film. The second electrode may be separated by the capacitive insulating film from the first electrode. A stack of the capacitive insulating film and the second electrode may together cover the both faces of the first electrode and the permanent supporter.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Figure 1:
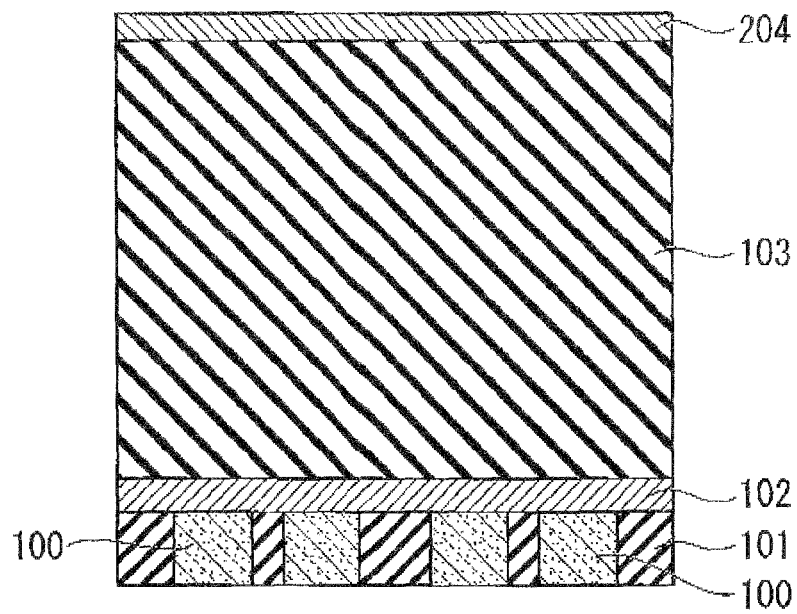
FIG. 1 is a fragmentary cross sectional elevation view illustrating a semiconductor device in a step involved in a method of forming the semiconductor device in accordance with the first preferred embodiment of the present invention.

Before describing the present invention, some embodiments of the related art will be described, in order to facilitate the understanding of the present invention.

The crown capacitor would be suitable to ensure the adequate capacitance with allowing shrinkage of the memory cell. The process for forming the crown capacitor include a process for forming a bottom electrode on an inside wall of a cylinder hole of a dummy insulating film. The dummy insulating film is then removed, while the bottom electrode for crown capacitor resides. A supporter is effective to prevent collapsing of the bottom electrode after the dummy insulating film is removed.

The supporter that prevents collapsing of the bottom electrode can be made of an insulating material such as silicon nitride which has a lower etching rate than that of the material of the dummy oxide film. The supporter of silicon nitride can be formed by a low pressure chemical vapor deposition process. The supporter of silicon nitride can prevent the formation of a short circuit between two adjacent bottom electrodes. Silicon nitride is hard to be etched by a hydrofluoric acid as an etchant for the wet etching process as compared to other materials used in the semiconductor processes.

The bottom electrode is formed on the inside wall of the cylinder hole of the dummy oxide film. Thus, the height of the bottom electrode is defined by the depth of the cylinder hole of the dummy oxide film. The depth of the cylinder hole of the dummy oxide film is defined by the thickness of the dummy oxide film. Thus, the height of the bottom electrode is defined by the thickness of the dummy oxide film. The increase in height of the bottom electrode needs increasing the thickness of the dummy oxide film. For example, the thickness of the dummy oxide film needs to be equal to or greater than 2 micrometers. In contrast, the supporter can generally be formed by a silicon nitride film that is much thinner than the dummy oxide film. For example, the silicon nitride film for the supporter is often thinner by a few times or several tens times than the dummy oxide film. In this case, the silicon nitride film for the supporter is substantially etched thereby greatly reducing the thickness of the silicon nitride film, while the dummy oxide film is completely etched by the wet etching process. The very thin silicon nitride supporter has a greatly reduced strength for mechanical support.

The etching rate of silicon nitride to silicon oxide is about 1:100. For example, the silicon nitride film for the supporter is etched by about 20 nm, while the dummy silicon oxide film of 2000 nm thickness is completely etched. As a result, the supporter has reduced strength for mechanical support. The adhesiveness of the supporter with the bottom electrode is reduced, thereby causing the bottom electrode to be removable from the supporter.

In one aspect, but not essentially, it would be desirable to ensure the adequacy of mechanical strength of the supporter for supporting the bottom electrode as well as ensure the adequacy of adhesiveness between the supporter and the bottom electrode.

The invention will be now described herein with reference to illustrative embodiments. Those skilled in the art will recognize that many alternative embodiments can be accomplished using the teaching of the present invention and that the invention is not limited to the embodiments illustrated for explanatory purpose.

First Embodiment

A first embodiment of the present invention will be described with, reference to FIGS. 1-13.
[Process for Forming Semiconductor Device]
A process for forming a semiconductor device in accordance with a first embodiment of the present invention will be described in details with reference to FIGS. 1-11. The process for forming the semiconductor device may include, but is not limited to, a stacking process, a through-hole formation process, a bottom electrode formation process, a temporary supporter formation process, an insulating film etching process, a permanent supporter formation process, a temporary supporter removal process, and a capacitor formation process.

The stacking process may include, but is not limited to, a process for sequentially stacking an inter-layer insulator for bottom electrode and an insulating film for temporary supporter.

The through-hole formation process may include, but is not limited to, a process for forming holes that penetrate the inter-layer insulator and the insulating film for temporary supporter.

The bottom electrode formation process may include, but is not limited to, a process for forming bottom electrodes on the side walls of the holes, wherein each bottom electrode has a bottom-closed cylinder shape.

The temporary supporter formation process may include, but is not limited to, a process for forming openings in the insulating film, thereby forming the temporary supporter.

The insulating film etching process may include, but is not limited to, a wet etching process for selectively removing the inter-layer insulator through the openings, wherein the temporary supporter is used as a mask.

The permanent supporter formation process may include, but is not limited to, a process for miming permanent supporters that support the bottom electrodes.

The temporary supporter removal process may include, but is not limited to, a process for removing the temporary supporter.

The capacitor formation process may include, but is not limited to, a process for forming a capacitive insulating film on the bottom electrode, and a process for forming a top electrode on the capacitive insulating film, thereby forming a crown capacitor.

(Stacking Process)

With reference to FIG. 1, a first inter-layer insulator 101 having capacitive contact plugs 100 that are buried in the first inter-layer insulator 101 has been prepared, before the stacking process will be initiated. An etching stopper film 102 is formed over the first inter-layer insulator 101 and the capacitive contact plugs 100. A second inter-layer insulator 103 for bottom electrode formation is formed over the etching stopper film 102. An insulating film 204 for temporary supporter formation is formed over the second inter-layer insulator 103. The insulating film 204 for temporary supporter formation is made of a material that is different from the material of the second inter-layer insulator 103.

In more detail, a semiconductor substrate is prepared. The semiconductor substrate is not illustrated in FIG. 1. Semiconductor devices such as MOS transistors are formed over the semiconductor substrate. Bit lines are formed over the semiconductor substrate. The bit lines are connected to the MOS transistors. The MOS transistors and the bit lines are not illustrated in FIG. 1. A first inter-layer insulator 101 is formed which covers the MOS transistors and the bit lines over the semiconductor substrate. In some cases, the first inter-layer insulator 101 may be made of, but is not limited to, silicon oxide. Capacitive contact plugs 100 are formed in the first inter layer insulator 101. The capacitive contact plugs 100 may be used to connect the MOS transistors over the semiconductor substrate and the bottom electrodes of the capacitors. In some cases, the capacitive contact plugs 100 may be made of, but is not limited, to, polysilicon or metals such as tungsten.

As shown in FIG. 1, an etching stopper film 102 may be formed over the first inter-layer insulator 101 and die capacitive contact plugs 100. The etching stopper film 102 may cover the first inter-layer insulator 101 and the capacitive contact plugs 100. In some cases, the etching stopper film 102 may be made of, but not limited to, silicon nitride. A second inter-layer insulator 103 may be formed over the etching stopper film 102. The second inter-layer insulator 103 may cover the etching stopper film 102. In some cases, the second inter-layer insulator 103 may be made of, but is not limited to, silicon oxide. An insulating film 204 for temporary supporter formation may be formed over the second inter-layer insulator 103. The insulating film 204 for temporary supporter formation may cover the second inter-layer insulator 103. In some cases, the insulating film 204 for temporary supporter formation may be made of a material that is different from the material of the second inter-layer insulator 103. In some cases, the insulating film 204 for temporary supporter formation may be made of but is not limited to polysilicon.

The etching stopper film 102 can be used to perform as an etching stopper when etching the second inter-layer insulator 103. The second inter layer insulator 103 can be used to form through holes therein, the through holes performing as bases for a bottom electrode of a capacitor. The insulating film 204 can be used as a hard mask for forming the through holes in the second inter-layer insulator 103. The insulating film 204 can also be used as a temporary supporter that temporary-support the bottom electrode of the capacitor.

When the capacitor is used as a capacitor of a memory cell in DRAM, the thickness of the second inter-layer insulator 103 may generally be, but is not limited to, in the range of 1 micrometer to 2 micrometers, and the thickness of the insulating film 204 performing as the hard mask and the temporary supporter may generally be, but is not limited to, in the range of about 40 micrometers to about 60 micrometers. The second inter-layer insulator 103 may preferably be made of a different material from the material of the insulating film 204 performing as the hard mask and the temporary supporter. The wet-etching rate of the insulating film 204 is lower than the wet-etching rate of the second inter-layer insulator 103. In some cases, the second inter-layer insulator 103 can be made of silicon oxide, and the insulating film 204 can be made of polysilicon.

Figure 2:
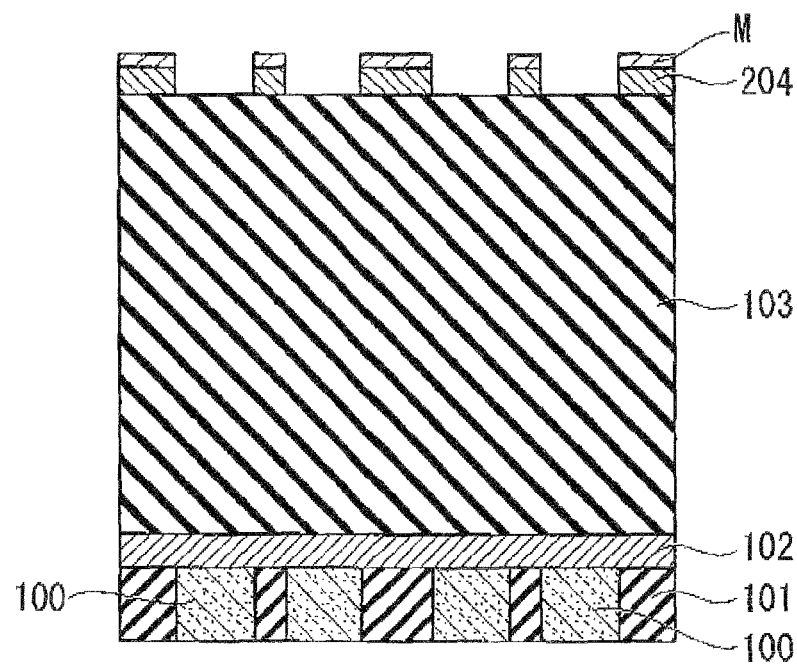
FIG. 2 is a fragmentary cross sectional elevation view illustrating a semiconductor device in a step subsequent to the step of FIG. 1, involved in the method of forming the semiconductor device in accordance with the first preferred embodiment of the present invention.

With reference to FIG. 2, a photo-resist film is formed over the insulating film 204 performing as the hard mask and the temporary supporter. A pattern of holes is formed in the photo-resist film, thereby forming a resist mask M.

(Through-Hole Formation Process)

Through holes 105 are formed which penetrate the insulating film 204 and the second inter-layer insulator 103 and reach the capacitive contact plugs 100.

As shown in FIG. 2, the insulating film 204 can be selectively and anisotropically etched by using the resist mask M, thereby forming a hard mask 204. In some cases, the etching process can be realized by, but not limited to, a plasma dry etching process using a chlorine gas.

Figure 3:
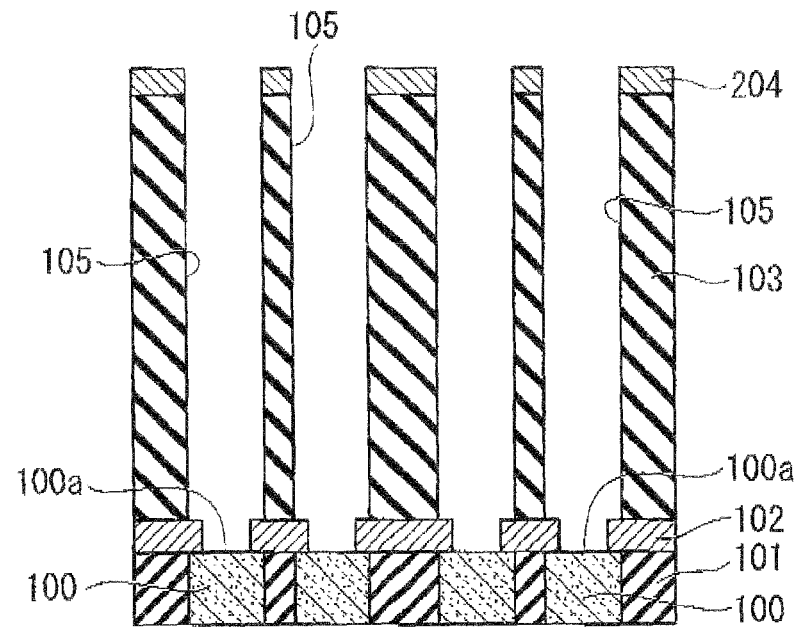
FIG. 3 is a fragmentary cross sectional elevation view illustrating a semiconductor device in a step subsequent to the step of FIG. 2, involved in the method of forming the semiconductor device in accordance with the first preferred embodiment of the present invention.

As shown in FIG. 3, the second inter-layer insulator 103 can be selectively and anisotropically etched by using the resist mask M and the hard mask 204, thereby forming through holes 105. The through holes 105 penetrate the insulating film 204 and the second inter-layer insulator 103 and reach the etching stopper film 102. The etching process can be stopped by the etching stopper film 102. In some cases, the etching process can be realized by, but not limited to, a plasma dry etching process using a fluorine gas. The resist mask M is removed. The etching stopper film 102 is partially shown through the through holes 105. The etching stopper film 102 has exposed portions that are positioned directly under the through holes 105. The etching stopper film 102 can be selectively and anisotropically etched so that the capacitive contact plugs 100 are shown through the through holes 105. The capacitive contact plugs 100 have exposed surfaces 100a which are shown through the through holes 105. The exposed surfaces 100a of the capacitive contact plugs 100 are positioned directly under the through holes 105

(Bottom Electrode Formation Process)

Bottom electrodes 106 may be formed in the through holes 105. The bottom electrodes 106 may each have a bottom-closed cylindrical shape. The bottom electrodes 106 may each extend over the bottom and side walls of the through hole 105. The bottom electrodes 106 may each extend along the side edge of the hard mask 204. The bottom electrodes 106 can be formed as follows.

Figure 4:
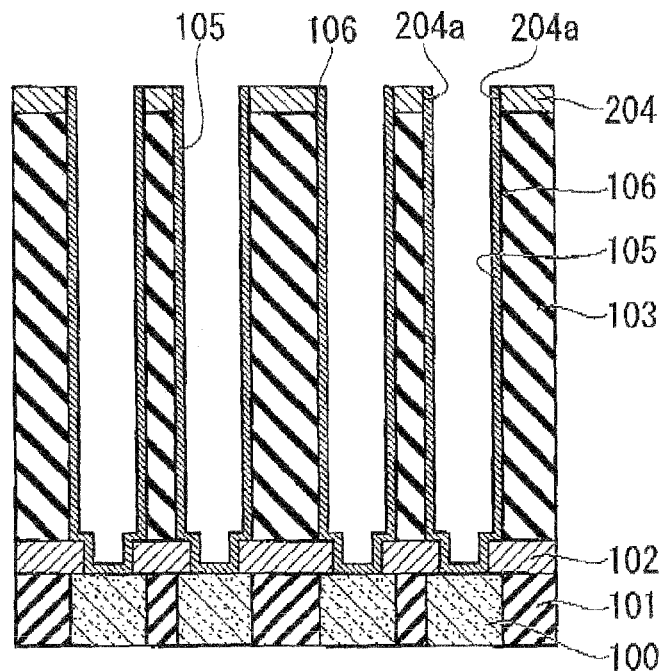
FIG. 4 is a fragmentary cross sectional elevation view illustrating a semiconductor device in a step subsequent to the step of FIG. 3, involved in the method of forming the semiconductor device in accordance with the first preferred embodiment of the present invention.

As shown in FIG. 4, a first conductive film, is formed, which covers the bottom and side walls of the through holes 105 and the top surface of the hard mask 204. The first conductive film extends along the bottom and side walls of the through holes 105 and over the top surface of the hard mask 204. In some cases, the first conductive film may be made of, but is not limited to, titanium nitride. The first conductive film may be selectively removed so mat the top surface of the hard mask 204 is exposed, while the first conductive film resides on the bottom and side walls of the through holes 105, thereby forming bottom electrodes 106 in the through holes 105. The bottom electrodes 106 in the through holes 105 are separate from each other. Each bottom electrode 106 extends over the bottom wall and along the side wall of the through hole 105. Selective removal of the first conductive film from the top surface of the hard mask 204 can be realized by, but not limited to, an etching process or a chemical mechanical polishing process. The bottom wall of the through hole 105 is constituted by the exposed surface 100a of the capacitive contact plug 100. The bottom electrode 106 contacts with the exposed surface 100a of the capacitive contact plug 100. Thus, the bottom electrode 106 is connected to the capacitive contact plug 100.

In some case, the bottom electrodes 106 may be made of, but not limited to, titanium nitride, tungsten, or noble metals such as ruthenium. A tungsten film has good coverage. When the first conductive film is made of titanium nitride, it may be preferable that a photo-resist fills up the through holes 105 so as to allow the photo-resist protects the first conductive film in the through holes 105, while the first conductive film over the hard mask 204 is removed. The bottom electrodes 106 are protected by the photo-resist from suffering the damages.

The bottom electrodes 106 extend along the side edges 204a of the hard mask 204. The bottom electrodes 106 are bonded to the side edges 204a of the hard mask 204. The hard mask 204 can perform not only as the hard mask but as the temporary supporter.

(Temporary Supporter Formation Process)

Openings 204b are formed in the hard mask 204, so as to partially expose the second inter-layer insulator 103, whereby the hard mask 204 becomes the temporary supporter 204c. Namely, the temporary supporter 204c has the openings 204b through which the second inter-layer insulator 103 are partially shown. The openings 204b and the temporary supporter 204c can be formed as follows.

Figure 5:
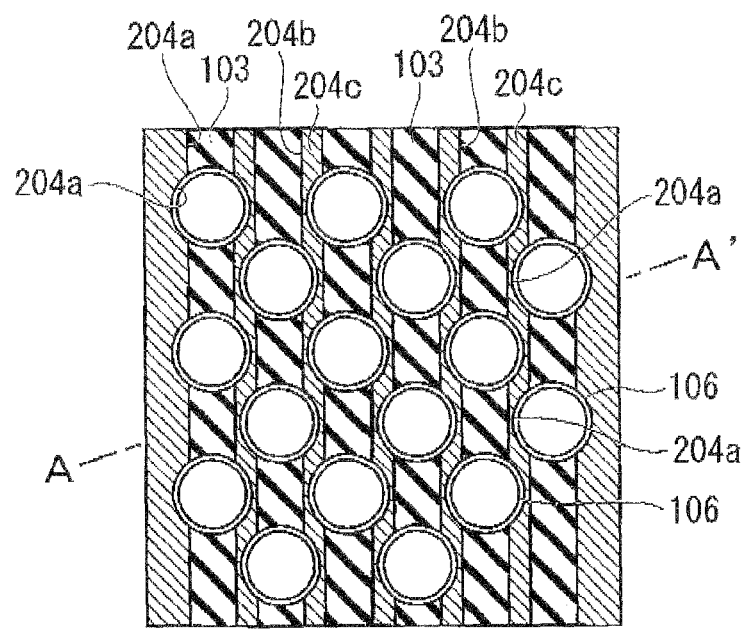
FIG. 5 is a fragmentary plan view illustrating a semiconductor device in a step subsequent to the step of FIG. 4, involved in the method of forming the semiconductor device in accordance with the first preferred embodiment of the present invention.
Figure 6:
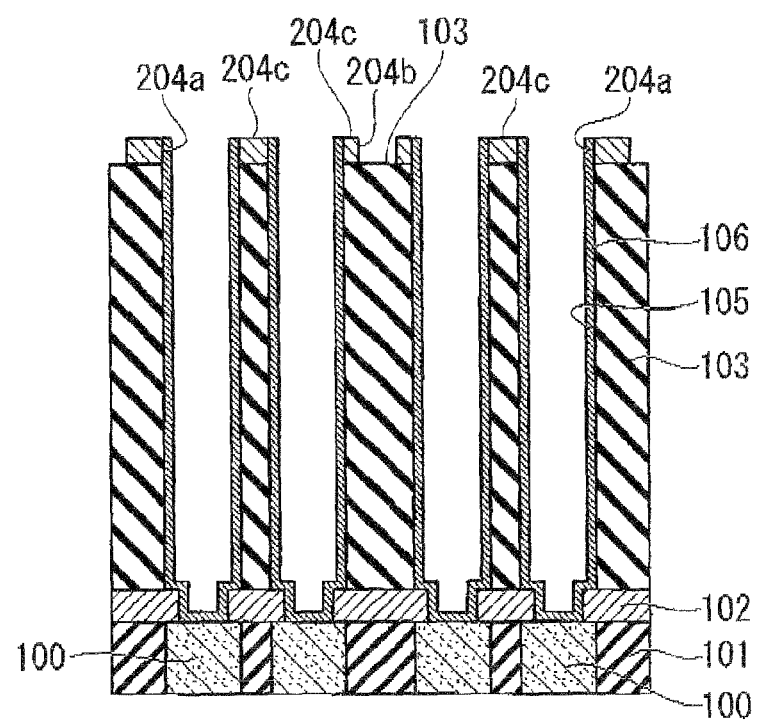
FIG. 6 is a fragmentary plan view illustrating the semiconductor device, taken along an A-A' line of FIG. 5.

With reference to FIGS. 5 and 6, a lithography process and a dry etching process may be used to form the openings 204b in the hard mask 204, thereby transforming the hard mask 204 into the temporary supporter 204c. When the hard mask 204 is made of polysilicon, the temporary supporter 204c is made of polysilicon. There is removed the resist mask that has been used for forming the openings 204b in the hard mask 204 and transforming the hard mask 204 into the temporary supporter 204c.

In some cases, the openings 204b may be realized by stripe-shape grooves which extend cross over the bottom electrodes 106 so that the openings 204b each bridge between the adjacent bottom electrodes 106, and also the openings 204b each separate the hard mask 204 into a plurality of separate stripe-shaped temporary supporters 204c. The plurality of separate stripe-shaped temporary supporters 204c may extend bridging the side portions of the openings 204b. The openings 204b may extend in generally parallel to each other. The plurality of separate stripe-shaped temporary supporters 204c may also extend in generally parallel to each other and further generally parallel to the openings 204b. A pair of the adjacent stripe-shaped temporary supporters 204c sandwiches the bottom electrode 106 at diametrically opposing ends thereof, wherein the diametrically opposing ends are diametrically distanced from, each other in a width direction of the stripe-shaped temporary supporters 204c. The width direction of the stripe shaped temporary supporters 204c is parallel to the width direction of the openings 204b. The bottom electrode 106 remains bonded to the side edge 204a of the stripe-shaped temporary supporters 204c. The bottom electrode 106 is sandwiched at diametrically opposing ends thereof by the paired adjacent stripe-shaped temporary supporters 204c. The paired adjacent stripe-shaped temporary supporters 204c can prevent the bottom electrode 106 from being collapsed, thereby preventing any formation of short circuit between the adjacent bottom electrodes 106.

The extension direction in which the stripe-shaped temporary supporters 204c and the stripe-shaped openings 204b extend may be optional as long as the extension direction is horizontal or parallel to the surface of the substrate. The extension direction may be modified to a perpendicular or oblique direction to that shown in FIG. 5.

As modifications, the openings 204b of the temporary supporters 204c may be realized by island-shape holes which each cover a plurality of bottom electrodes 106, so that the plurality of bottom electrodes 106 are supported by the temporary supporters 204c. The peripheral edges of the island-shape hole are positioned near the plurality of bottom electrodes 106 so as to allow the plurality of bottom electrodes 106 to be supported by the temporary supporters 204c. For example, the peripheral edges of each island-shape opening surrounds in plan view a group of bottom electrodes 106 that are disposed adjacently to each other so that the grouped bottom electrodes 106 that are disposed adjacently to each other are supported by the temporary supporters 204c. The shape of the openings of the temporary supporters 204c may be optional as long as the peripheral edges of the openings run near the plurality of bottom electrodes 106 so as to allow the plurality of bottom electrodes 106 to be supported by the temporary supporters 204c.

(Insulating Film Etching Process)

The second inter-layer insulator 103 may be removed, while the bottom electrodes 106 are mechanically supported by the temporary supporters 204c and are connected to each other via the temporary supporters 204c. Removal of the second inter-layer insulator 103 can be realized by, but not limited to, a wet etching process which exposes the second inter-layer insulator 103 to an etchant through the stripe-shaped openings 204b.

Figure 7:
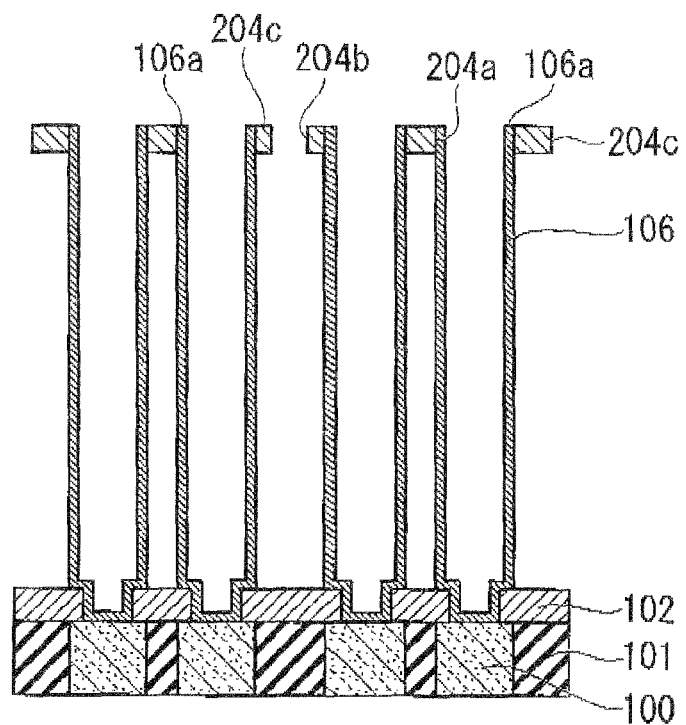
FIG. 7 is a fragmentary cross sectional elevation view illustrating a semiconductor device in a step subsequent to the step of FIGS. 5 and 6, involved in the method of forming the semiconductor device in accordance with the first preferred embodiment of the present invention.

With reference to FIG. 7, the wet etching process can be carried out, but not limited to, exposing the second inter-layer insulator 103 through the stripe-shaped openings 204b to an etchant such as a concentrated hydrofluoric acid of about 50% concentration at the ordinary temperature, thereby removing the second inter-layer insulator 103 of silicon oxide. The etchant is flown through the stripe-shaped openings 204b into the second inter-layer insulator 103 of silicon oxide, thereby etching the second inter-layer insulator 103. The etching stopper film 102 performs as the etching stopper to the wet etching process. The wet etching process is stopped by the etching stopper film 102. After the second inter-layer insulator 103 of silicon oxide is removed, an array of the bottom electrodes 106 of the bottom-closed cylinder shape extends vertically to the surface of the first inter-layer insulator 101, wherein the bottom electrodes 106 are mechanically connected to each other via the temporary supporters 204c and mechanically supported by the temporary supporters 204c. The bottom electrode 106 remains bonded to the side edge 204a of the stripe-shaped temporary supporters 204c, so that the bottom electrodes 106 are mechanically connected to each other via the temporary supporters 204c and mechanically supported by the temporary supporters 204c. The wet etching process exposes the top surface 106a of the bottom electrodes 106.

(Permanent Supporter Formation Process)

Permanent supporters 205 may be formed to permanently support the bottom electrodes 106. The permanent supporters 205 mechanically support the bottom electrodes 106 in later processes until the manufacturing process for the semiconductor device is completed. The permanent supporters 205 will reside in the semiconductor device so that the permanent supporters 205 mechanically support the bottom electrodes 106 after the manufacturing process for the semiconductor device is completed. In some cases, the permanent supporters 205 may be made of, but is not limited to, a material that is different from the material of the temporary supporters 204c.

The permanent supporters 205 may be formed over the temporary supporters 204c and the top surfaces 106a of the bottom electrodes 106. The permanent supporters 205 may be made of an insulating material. The permanent supporters 205 can be formed by, but not limited to, a plasma chemical vapor deposition. The permanent supporters 205 may each have varying width in the thickness direction. The permanent supporters 205 may each increase in width as its position or level becomes higher.

Figure 8:
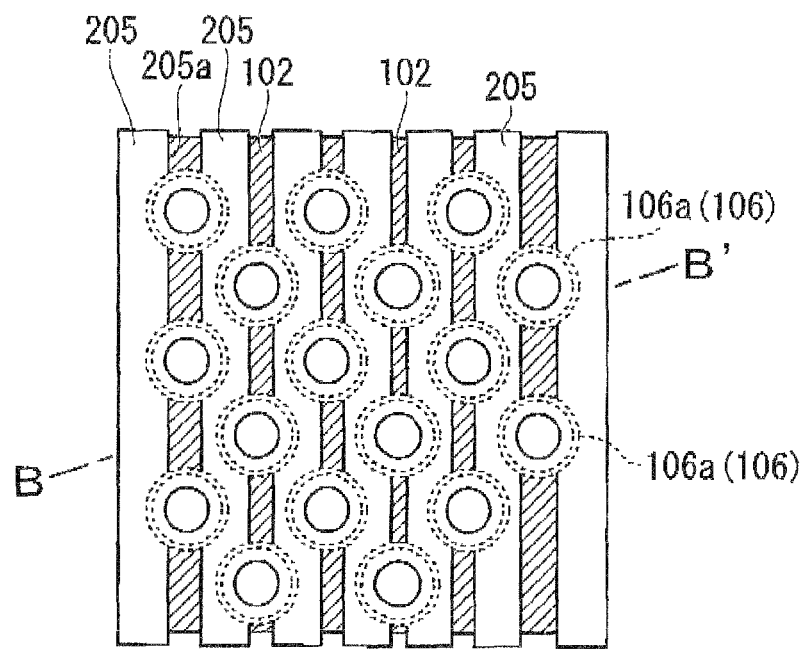
FIG. 8 is a fragmentary plan view illustrating a semiconductor device in a step subsequent to the step of FIG. 7, involved in the method of forming the semiconductor device in accordance with the first preferred embodiment of the present invention.
Figure 9:
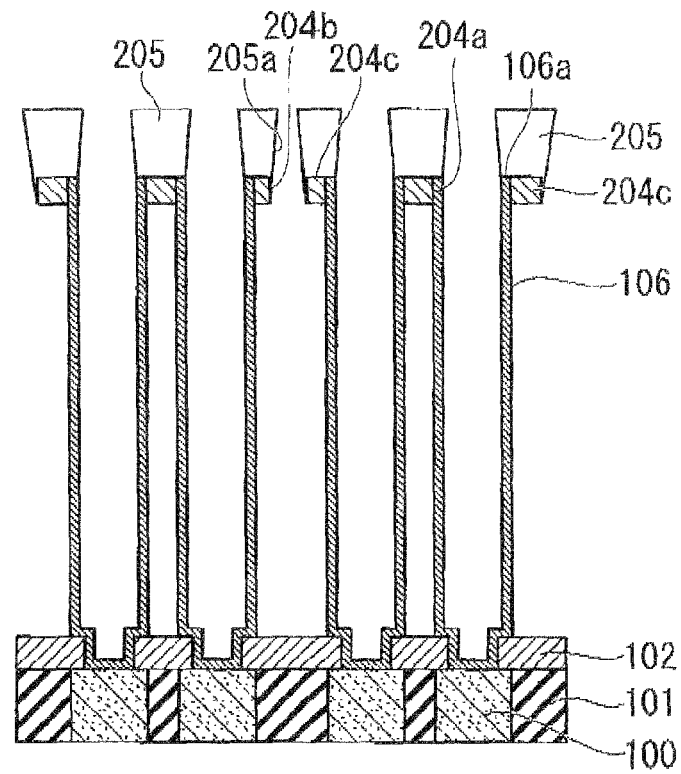
FIG. 9 is a fragmentary cross sectional elevation view illustrating the semiconductor device, taken along a B-B' line of FIG. 8.

With reference to FIGS. 8 and 9, an insulating film is deposited over each set of the temporary supporters 204c and the top surfaces 106a of the bottom electrodes 106, thereby forming a plurality of separate stripe-shaped permanent supporters 205 over the sets of the temporary supporters 204c and the top surfaces 106a of the bottom electrodes 106 as shown in FIG. 9. The stripe shaped permanent supporters 205 may each have a stripe shape in plan view. The stripe shaped permanent supporters 205 may be disposed to be generally parallel to each other. The two adjacent stripe-shaped permanent supporters 205 may be separated from each other by a stripe-shaped opening 205a. Each stripe-shaped opening 205a extends between the two adjacent stripe-shaped permanent supporters 205. Each stripe-shaped opening 204a separates the two adjacent stripe-shaped temporary supporters 204c. Each stripe-shaped opening 205a separates the two adjacent stripe-shaped permanent supporters 205. The stripe-shaped openings 205a communicate with the stripe-shaped openings 204a. The stripe-shaped openings 205a are positioned directly over the stripe-shaped openings 204a.

The stripe-shaped permanent supporters 205 each have a bottom face that is bonded to the top surface 106a of the bottom electrodes 106, so that the bottom electrodes 106 are mechanically supported by a pair of the two adjacent stripe-shaped permanent supporters 205. The bottom electrodes 106 are aligned in the direction parallel to the extension direction of the stripe-shaped permanent supporters 205. The stripe-shaped permanent supporters 205 mechanically supporting the bottom electrodes 106 can prevent the bottom electrodes 106 from being collapsed, thereby preventing formation of short circuit between the adjacent bottom electrodes 106.

The extension direction in which the stripe-shaped permanent supporters 205 and the stripe-shaped openings 205a extend may be optional as long as the extension direction is horizontal or parallel to the surface of the substrate. The extension direction may be modified to a perpendicular or oblique direction to that show in FIG. 8. The etching stopper film 102 is partially shown through the stripe-shaped openings 204a and 205a.

The permanent supporters 205 may preferably be made of a different material from the material of the temporary supporter 204c. In some cases, the permanent supporters 205 may be made of, but is not limited to, silicon nitride or silicon oxide, while the temporary supporter 204c is made of polysilicon. The silicon nitride film or the silicon oxide film has a lower etching rate to an etchant than the etching rate of the polysilicon film. When the permanent supporters 205 are made of silicon nitride or silicon oxide and the temporary supporter 204c is made of polysilicon, it is possible that the temporary supporter 204c will be etched by the wet etching process, while the permanent supporters 205 will not etched by the wet etching process.

The permanent supporters 205 of silicon oxide can be formed as follows. A plasma chemical vapor deposition process can be available to form the permanent supporters 205 of silicon oxide. Tetraethoxysilane (TEOS) is used as a source gas. A high frequency power application can be carried out at two different frequencies and powers to the source gas to cause plasma. The higher frequency power may be, but not limited to, 650 W at 13.56 MHz. The lower frequency power may be, but not limited to, 500 W at 400 MHz. The silicon oxide film deposition process can be carried out at, but not limited to, 350° C.

The permanent supporters 205 of silicon nitride can be formed as follows. A plasma chemical vapor deposition process can be available to form the permanent supporters 205 of silicon nitride. Silane ($SiH_4$) and ammonium are used as source gases. A high frequency power application can be carried out at but not limited to, 700 W, 13.56 MHz and 350° C.

The plasma chemical vapor deposition process has such low step coverage as to cause almost no deposition on the inside and output faces of lower portions of the bottom electrodes 106. The lower portions of the bottom electrodes 106 are portions that are not higher than a level having a depth of 30 nm from the top surfaces 106a of the bottom electrodes 106. When the semiconductor device is applied to the DRAM device having a minimum dimension of 70 nm, the thickness of the permanent supporters 205 may be preferable, bat not limited to, in the range of about 70 nm to about 150 nm. Increase in thickness of the permanent supporters 205 will increase the mechanical strength, of the permanent supporters 205.

As modifications, the shape of the permanent supporters 205 may be optional as long as the permanent supporters 205 extend near a plurality of bottom electrodes 106 so as to allow the plurality of bottom electrodes 106 to be supported by the permanent supporters 205. The permanent supporter 205 may be realized by a permanent support layer that has a plurality of island-shape openings, provided that the permanent supporter 205 covers the plurality of bottom electrodes 106, so that the plurality of bottom electrodes 106 are supported by the permanent supporter 205. The peripheral edges of the island-shape opening are positioned near the plurality of bottom electrodes 106 so as to allow the permanent supporter 205 to connect and support the plurality of bottom electrodes 106.

(Temporary Supporter Removal Process)

The temporary supporters 204c are removed, while the permanent supporters 205 remain to mechanically support the bottom electrodes 106. Removal of the temporary supporters 204c can be realized by, but not limited to carrying out an etching process.

Figure 10:
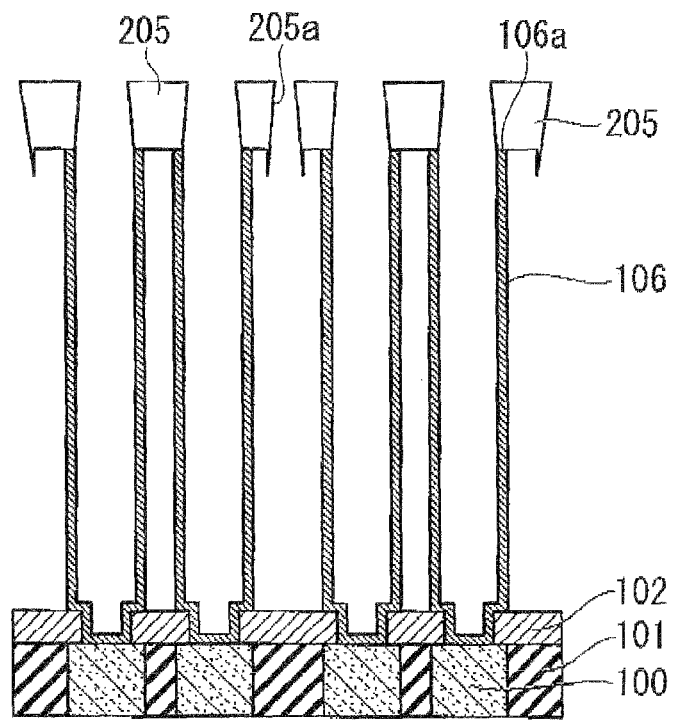
FIG. 10 is a fragmentary cross sectional elevation view illustrating a semiconductor device in a step subsequent to the step of FIG. 9, involved in the method of forming the semiconductor device in accordance with the first preferred embodiment of the present invention.

With reference to FIG. 10, the temporary supporters 204c can be removed a follows. A wet etching process may be carried out using an etchant. The temporary supporters 204c may be exposed to the etchant. The etchant is flown through the stripe-shaped openings 205a to the temporary supporters 204c, thereby etching and removing the temporary supporters 204c. In some cases, the etchant may be, but is not limited to, a mixture of hydrofluoric acid and nitric acid, or diluted ammonium water. Removal of the temporary supporters 204c of polysilicon causes that the bottom electrodes 106 are eclectically isolated, as long as the permanent supporters 205 are made of an insulator such as silicon oxide or silicon nitride.

In some cases, the etchant is diluted ammonium, water. The permanent supporters 205 are made of silicon oxide or silicon nitride, and the temporary supporters 204c are made of polysilicon. In these cases, the diluted ammonium water to be used as an etchant may preferably have a concentration of about 0.5%. In this case, the etchant can etch the temporary supporters 204c of polysilicon at high etching rate, while the etchant almost will not etch the bottom electrodes 106 and the permanent supporters 205. The concentration of about 0.5% is the ordinal concentration of diluted ammonium water to be used in the semiconductor cleaning process.

In some cases, the etchant is a mixture of hydrofluoric acid and nitric acid. The permanent supporters 205 are made of silicon oxide or silicon nitride, and the temporary supporters 204c are made of polysilicon. In these cases, the mixture of > hydrofluoric acid and nitric acid to be used as an etchant may preferably have a mixing ratio of nitric acid to 50%-concentrated hydrofluoric acid being about 200:1.

When the etchant is diluted ammonium water, a pre-cleaning process may preferably and optionally be carried out to remove the oxide film from the polysilicon surface of the temporary supporters 204c. If the oxide film resides on the polysilicon surface of the temporary supporters 204c, it is difficult to etch the temporary supporters 204c of polysilicon completely. The pre-cleaning process may be carried out using an etchant of, but not limited to, about 1%-diluted hydrofluoric acid. The pre-cleaning process may be effective to permit the wet etching process for a short, time period such as in the range of about 20 seconds to about 30 seconds to remove the temporary supporters 204c of polysilicon completely. The pre-cleaning process may be effective to remove a thin, insulating film having a few nanometers thickness from the inside and outside faces of the above-described lower portion of the bottom electrode 106. The lower portions of the bottom electrodes 106 are portions that are not higher than a level having a depth of 30 nm from the top surfaces 106a of the bottom electrodes 106.

In other cases, the etching process for etching the temporary supporters 204c can be carried out using an etchant of a mixture of the above-described 0.5%-concentrated ammonium water with the about 1%-diluted hydrofluoric acid. The use of the etchant of a mixture of the above-described 0.5%-concentrated ammonium water with the about 1%-diluted hydrofluoric acid may be effective to permit the wet etching process for a short time period such as in the range of about 20 seconds to about 30 seconds to remove not only the temporary supporters 204c of polysilicon completely but also a thin insulating film having a few nanometers thickness from the inside and outside faces of the above-described lower portion of the bottom electrode 106. The lower portions of the bottom electrodes 106 are portions that are not higher than a level having a depth of 30 nm from, the top surfaces 106a of the bottom electrodes 106.

Removal of the temporary supporters 204c results in that the permanent supporters 205 are disposed in parallel to each other and distanced from each other by the stripe-shaped openings 205a. The permanent supporters 205 have bottom faces that are bonded to the top surfaces 106a of the bottom electrodes 106. A plurality of the aligned bottom electrodes 106 is mechanically supported by the pair of two adjacent stripe-shaped permanent supporters 205. The aligned bottom electrodes 106 are mechanically connected to each other by the pair of two adjacent stripe-shaped permanent supporters 205. The aligned bottom electrodes 106 are electrically isolated from each other as long as the permanent supporters 205 are made of an insulator.

(Capacitor Formation Process)

Capacitors 220 are formed in the through holes 105. A capacitive insulating film 206 is formed on the exposed surfaces of the bottom electrodes 106. A top electrode 207 is formed on the capacitive insulating film 206. The top electrode 207 is > separated from the bottom electrodes 106 by the capacitive insulating film 206. The capacitors 220 each include the bottom electrodes 106, the capacitive insulating film 206, and the top electrode 207.

Figure 11:
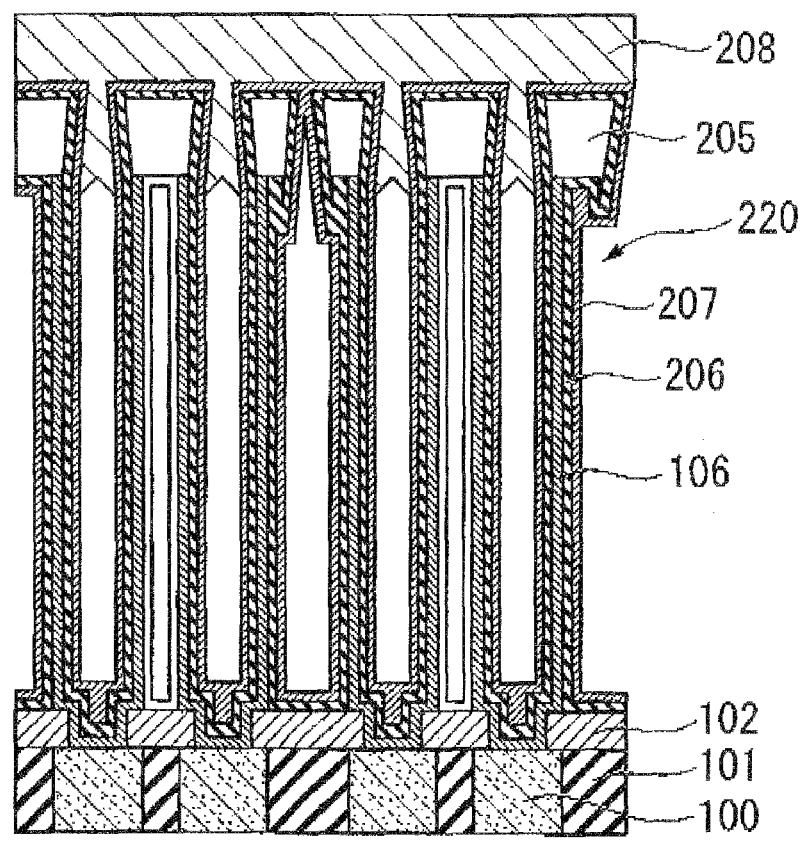
FIG. 11 is a fragmentary cross sectional elevation view illustrating a semiconductor device in a step subsequent to the step of FIG. 10, involved in the method of forming the semiconductor device in accordance with the first preferred embodiment of the present invention.

With reference to FIG. 11, a capacitive insulating film 206 is formed on the surfaces of the permanent supporters 205 and on the entirety of the exposed surfaces of the bottom electrodes 106 of bottom-closed cylinder shape. The capacitive insulating film 206 covers the surfaces of the permanent supporters 205 and the entirety of the exposed surfaces of the bottom electrodes 106 of bottom-closed cylinder shape. The top electrode 207 is formed on the capacitive insulating film 206. The stack of the capacitive insulating film 206 and the top electrode 207 is formed on the surfaces of the > permanent supporters 205 and on the entirety of the exposed surfaces of the bottom electrodes 106 of bottom-closed cylinder shape. The stack of the capacitive insulating film 206 and the top electrode 207 covers the surfaces of the permanent supporters 205 and the entirety of the exposed surfaces of the bottom electrodes 106 of bottom-closed cylinder shape.

The bottom electrodes 106 and the permanent supporters 205 are together covered by the stack of the capacitive insulating film 206 and the top electrode 207, thereby ensuring that the bottom electrodes 205 are bonded to the permanent supporters 205.

The stack of the capacitive insulating film 206 and the top electrode 207 extend both the inside and outside faces of the side wall portion of the bottom-closed cylinder shaped bottom electrode 106. The inside and outside faces of the side wall portion of the bottom-closed cylinder-shaped bottom electrode 106 can be used to form the capacitor. Use of the inside and outside faces of the side wall portion of the bottom-closed cylinder-shaped bottom electrode 106 is larger in capacitance by about two times than use of the inside face only of the side wall portion of the bottom-closed cylinder-shaped bottom electrode as long as the capacitors have substantially the same dimensions. Use of the inside and outside faces of the side wall portion of the bottom-closed cylinder-shaped bottom electrode 106 is effective to ensure increased capacitance without increasing the dimensions of the capacitor.

A common electrode 208 is formed over the top electrode 207.

In some cases, the capacitive insulating film 206 may be realized by, but not limited to, a single-layered structure of insulator or multi-layered structure of insulator. Typical examples of the single-layered structure of insulator for the capacitive insulating film 206 may include, but are not limited to, an aluminum oxide film, a hafnium oxide film, a zirconium oxide film, and a tantalum oxide film. Typical examples of the multi-layered structure of insulator may include, but are not limited to, any stack of two or more films such as an aluminum oxide film, a hafnium oxide film, a zirconium oxide film, and a tantalum oxide film. The capacitive insulating film 206 may be formed by, but not limited to, an atomic layer deposition (ALD) method. The top electrode 207 may preferably be made of a conductive material having good coverage. The common electrode 208 may preferably be made of a different conductive material having a lower resistance than the conductive material of the top electrode 207. In some cases, the top electrode 207 may be made of, but not limited to, titanium nitride, and the common electrode 208 may be made of, but not limited to, tungsten. The crown capacitors 220 are formed, which each include the bottom electrodes 106, the capacitive insulating film 206, and the top electrode 207. The common electrode 208 is disposed over the capacitors 220.

The crown capacitors 220 utilize the inside and outside faces of the side wall portion of the bottom-closed cylinder-shaped bottom electrode 106. Namely, the inside and outside faces of the side wall portion of the bottom-closed cylinder-shaped bottom electrode 106 can, be used to form the capacitor. Use of the inside and outside faces of the side wall portion of the bottom-closed cylinder-shaped bottom electrode 106 is larger in capacitance by about two times than use of the inside face only of the side wall portion of the bottom-closed cylinder-shaped bottom electrode as long as the capacitors have substantially the same dimensions. Use of the inside and outside faces of the side wall portion of the bottom-closed cylinder-shaped bottom electrode 106 is effective to ensure increased capacitance without increasing the dimensions of the capacitor.

[Semiconductor Device]

The crown capacitors 220 that have been formed in the processes described above with reference to FIGS. 1-11 can be applied to any types of semiconductor device such as DRAMs. A semiconductor device such as a DRAM including the crown capacitors 220 of FIG. 11 will be described with reference to FIG. 12.

Figure 12:
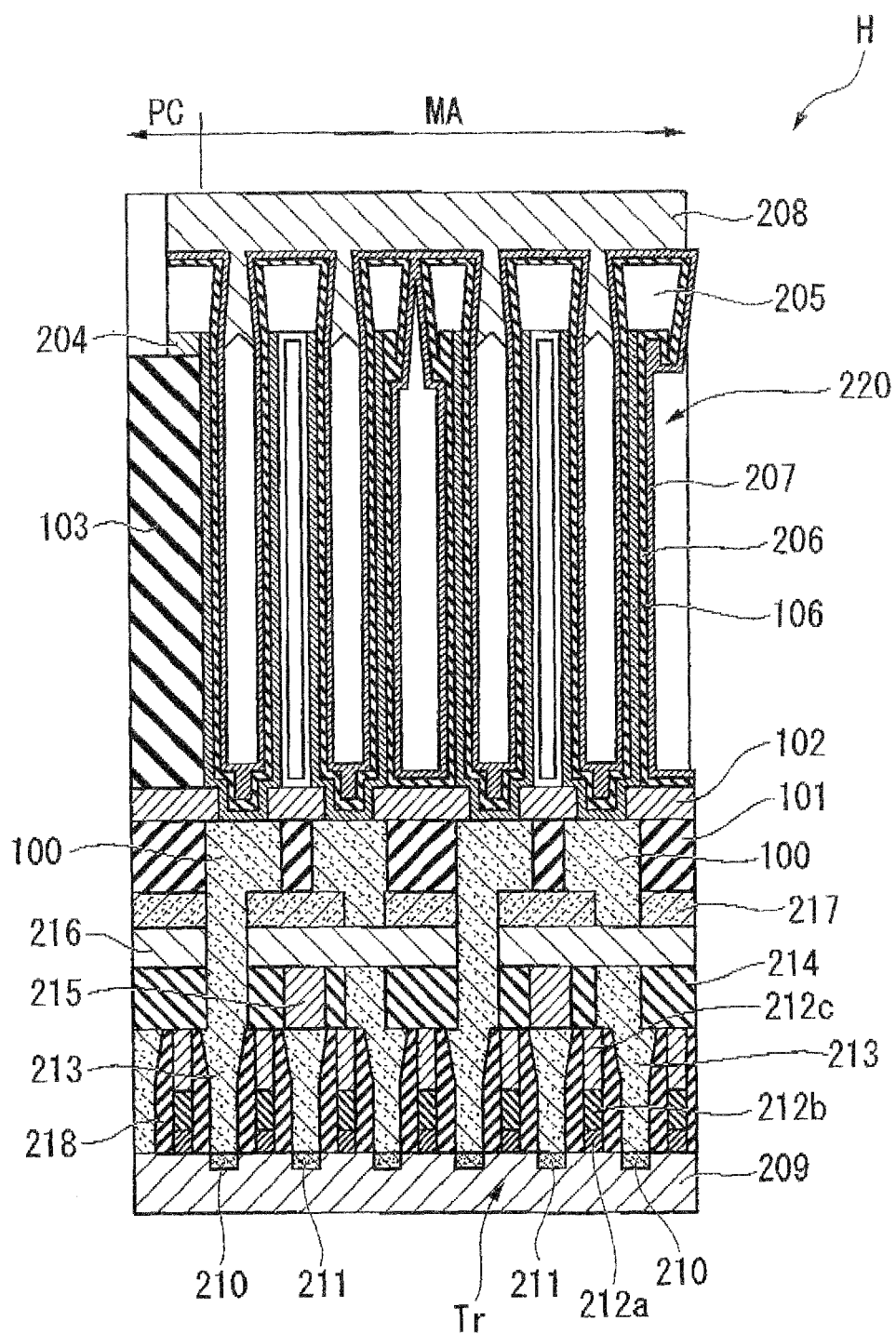
FIG. 12 is a fragmentary cross sectional elevation view Illustrating a dynamic random access memory including the device of FIG. 11.

With reference to FIG. 12, a semiconductor device H is disposed over a semiconductor substrate 209. In some cases, the semiconductor device H may be, but is not limited to, a DRAM. In some cases, the semiconductor substrate 209 may be, but is not limited to, a silicon substrate. The semiconductor device H may typically include, but is not limited to, transistors Tr and the capacitors 220 that have been described with reference to FIGS. 1-11. The capacitors 220 are electrically connected to the transistors Tr. The transistors Tr may be disposed over the semiconductor substrate 209. The capacitors 220 may be disposed over the transistors Tr.

The transistors Tr may each include, but is not limited to, source and drain diffusion layers 210 and 211, gate insulating films 212a, and gate electrodes 212b. The source and drain diffusion layers 210 and 211 are disposed in shallower regions of the semiconductor substrate 209. The gate insulating films 212a are disposed over the surface of the semiconductor substrate 209. The gate electrodes 212b are disposed over the gate insulating films 212a. The gate electrodes 212b perform gate electrodes and gate-lines. Contact plugs 213 are disposed directly over the source and drain diffusion layers 210 and 211. The contact plugs 213 contact with the source and drain diffusion layers 210 and 211. The contact plugs 213 are each disposed between two adjacent gate electrodes 212b.

An inter-layer insulator 214 may be disposed over the transistors Tr and the semiconductor substrate 209. The inter-layer insulator 214 may have contact holes in which bit-line contact plugs 215 are disposed. The bit line contact plugs 215 are also disposed directly over the contact plugs 213. The bit-line contact plugs 215 are electrically connected through the contact plugs 213 to the drain diffusion layers 211 of the transistors Tr.

Bit lines 216 are disposed over the inter-layer insulator 214. The bit lines 216 contact with the bit-line contact plugs 215. The bit lines 216 are electrically connected through the bit-line contact plugs 215 and the contact plugs 213 to the drain diffusion layers 211 of the transistors Tr.

An inter-layer insulator 217 may be disposed over the bit lines 216 and the inter-layer insulator 214. An inter-layer insulator 101 may be disposed over the inter-layer insulator 217. Capacitive contact plugs 100 may be disposed which penetrate the stack of the inter-layer insulators 214, 217 and 101. The capacitive contact plugs 100 contact the contact plugs 213. The capacitive contact plugs 100 are electrically connected through the contact plugs 213 to the source diffusion layers 212 of the transistors Tr.

The crown capacitors 220 may be disposed over the inter-layer insulator 101. The crown capacitors 220 are electrically connected through the capacitive contact plugs 100 and the contact plugs 213 to the source diffusion layers 212 of the transistors Tr.

The crown capacitors 220 can be formed in accordance with the series of processes described above with reference to FIGS. 1-11. The crown capacitors 220 may each include the bottom electrode 106, the capacitive insulating film 206, and the top electrode 207.

The first inter-layer insulator 101 has capacitive contact plugs 100. The capacitive contact plugs 100 are buried in the first inter-layer insulator 101. The bottom electrodes 106 may be disposed over the capacitive contact plugs 100 that are buried in the first inter-layer insulator 101. The bottom electrodes 106 contact the capacitive contact plugs 100. The bottom electrodes 106 may each have a bottom-closed cylinder shape.

The permanent supporters 205 are disposed over the top surfaces 106a of the bottom electrodes 106. The permanent supporters 205 are bonded to the top surfaces 106a of the bottom electrodes 106. The permanent supporters 205 mechanically 3 connect the bottom electrodes 106 that are aligned in the direction parallel to the extension direction along which the permanent supporters 205 extend.

The capacitive insulating film 206 may be disposed on the surfaces of the permanent supporters 205 and on the entirety of the exposed surfaces of the bottom electrodes 106 of bottom-closed cylinder shape. The capacitive insulating film 206 may cover the surfaces of the permanent supporters 205 and the entirety of the exposed surfaces of the bottom electrodes 106 of bottom-closed cylinder shape. The top electrode 207 may be disposed on tire capacitive insulating film 206. The stack of the capacitive insulating film 206 and the top electrode 207 may be disposed on the surfaces of the permanent supporters 205 and on the entirety of the exposed surfaces of the bottom electrodes 106 of bottom-closed cylinder shape. The slack of the capacitive insulating film 206 and the top electrode 207 may cover the surfaces of the permanent supporters 205 and the entirety of the exposed surfaces of the bottom electrodes 106 of bottom-closed cylinder shape. The bottom electrodes 106 and the permanent supporters 205 may be together covered by the stack of the capacitive insulating film 206 and the top electrode 207, thereby ensuring that the bottom electrodes 205 are bonded to the permanent supporters 205.

With reference to FIG. 12, the semiconductor device H may include a memory cell array area MA and a peripheral circuit area PC. The inter-layer insulator 103 resides in the peripheral circuit area PC, while the inter-layer insulator 103 is removed in the memory cell array area MA. In the peripheral circuit area PC, the inter-layer insulator 103 performs as an inter-layer insulator. In the memory cell array area MA, the inter-layer insulator 103 is absent. The inter-layer insulator 103 is selectively removed, so that the inter-layer insulator 103 resides in the peripheral circuit area PC, while the inter-layer insulator 103 is removed in the memory cell array area MA. Selective removal of the inter-layer insulator 103 can be realized by using a hard mask 204 of polysilicon. The hard mask 204 of polysilicon resides in the peripheral, circuit area PC. Namely, the inter-layer insulator 103 and the hard mask 204 of polysilicon reside in the peripheral circuit area PC.

Figure 13:
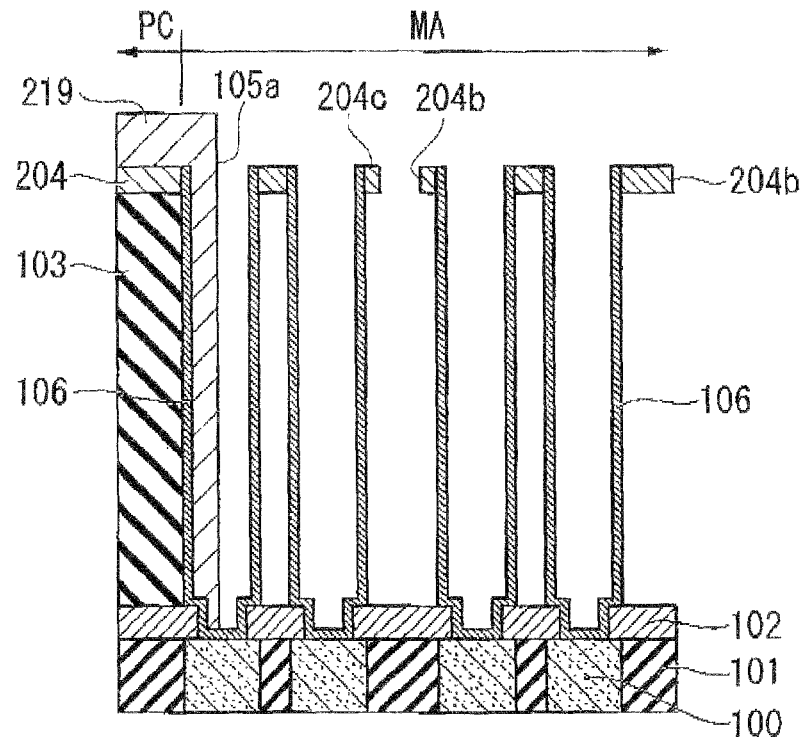
FIG. 13 is a fragmentary cross sectional elevation of the semiconductor device in a step for processing a boundary region between a memory cell area and a peripheral circuit, area in accordance with the first preferred embodiment of the present invention.

With reference to FIG. 13, a photo-resist pattern 219 is formed before the through holes 105 are formed in the memory cell array area MA. The photo-resist pattern 219 has a dummy groove 105a that extends in the memory cell array area MA. Namely, the peripheral circuit area PC is covered by the photo-resist pattern 219, while the memory cell array area MA is not covered by the photo-resist pattern 219. The etching process is carried out using the photo-resist pattern 219 as a mask, thereby selectively etching the inter layer insulator 103 in the memory cell array area MA as shown in FIGS. 3 and 13, while leaving the inter-layer insulator 103 in the peripheral circuit area PC as shown in FIG. 13.

If the hard mask 204 should be removed from the peripheral circuit area PC, it is possible to remove the hard mask 204 from the peripheral circuit area PC. Removal of the hard mask 204 from the peripheral circuit area PC can be carried out by an etching process using an inversion pattern to the photo-resist pattern 219.

In accordance with the above-described processes for forming the semiconductor device, the temporary supporters 204c of polysilicon are formed to mechanically support the bottom electrodes 106. Then, the inter-layer insulator 103 is selectively etched in the memory cell array area MA as shown in FIGS. 3 and 13, while the temporary supporters 204c of polysilicon mechanically support the bottom electrodes 106. After the selective etching process for etching the inter-layer insulator 103 is completed, the permanent supporters 205 are formed. It is not possible that the permanent supporters 205 are etched in part or whole by the etching process for selectively removing the inter-layer insulator 103. The permanent supporters 205 are not reduced in mechanical strength. The permanent supporters 205 are not reduced in bonding strength to the bottom electrodes 106.

The temporary supporters 204c of polysilicon are removed after the permanent supporters 205 are formed. The permanent supporters 205 are exposed to the etchant that is intended to be used to etch the temporary supporters 204c of polysilicon. The temporary supporters 204c of polysilicon have a thickness of several tends nanometers. The temporary supporters 204c of polysilicon is very thin so that the temporary supporters 204c of polysilicon can be removed, while the permanent supporters 205 are almost not etched, by carrying out the wet etching process for a short time. The permanent supporters 205 are almost not reduced in mechanical strength. The permanent supporters 205 are almost not reduced in bonding strength to the bottom electrodes 106.

The permanent supporters 205 are formed which cover the top surfaces 106a of the bottom electrodes 106 and the temporary supporters 204c, while the temporary supporters 204c mechanically support the bottom electrodes 106. The temporary supporters 204c mechanically supporting the bottom electrodes 106 allows the permanent supporters 205 to have an increased thickness, thereby increasing the mechanical strength of the permanent supporters 205.

The permanent supporters 205 are formed, which each cover a pair of the temporary supporter 204c and the top surface 106a of the bottom electrode 106. The permanent supporters 205 have bottom faces that are securely bonded to the top surfaces 106a of the bottom electrodes 106. The permanent supporters 205 are unlikely to be removed from the bottom electrodes 106. The stripe-shaped permanent supporters 205 mechanically supporting the bottom electrodes 106 can prevent the bottom electrodes 106 from being collapsed, thereby preventing formation of short circuit between the adjacent bottom electrodes 106. The stripe-shaped permanent supporters 205 can also prevent paired-bits or grouped bits from defect. The bottom electrodes 106 and the permanent supporters 205 are together covered by the stack of the capacitive insulating film 206 and the top electrode 207, thereby further ensuring that the bottom electrodes 205 are bonded to the permanent supporters 205. The stack of the capacitive insulating film 206 and the top electrode 207 in combination with the permanent supporters 205 can ensure preventing the bottom electrodes 106 from being collapsed, thereby preventing formation of short circuit between the adjacent bottom electrodes 106. The stack of the capacitive insulating film 206 and the top electrode 207 in combination with the permanent supporters 205 can ensure preventing paired-bits or grouped bits from defect.

The materials for the inter-layer insulator 103 and the temporary supporter 204c are different from each other, so as to allow a wet etching process to be carried out using an etchant, so that the wet etching rate of the inter-layer insulator 103 is much greater than the wet etching rate of the temporary supporter 204c. Namely, the inter-layer insulator 103 is etched, while the temporary supporter 204c is almost not etched. In some cases, the inter-layer insulator 103 may be made of silicon oxide, and the temporary supporter 204c may be made of polysilicon, so that the inter-layer insulator 103 is etched, while the temporary supporter 204c is almost not etched. Almost no etching of the temporary supporter 204c will result in almost no reduction of the mechanical strength of the temporary supporter 204c.

The permanent supporters 205 may be made of a material that is different from the material for the temporary supporter 204c, so as to allow a wet etching process to be carried out using an etchant, so that the wet etching rate of the temporary supporter 204c is much greater than the wet etching rate of the permanent supporters 205. Namely, the temporary supporter 204c is etched, while the permanent supporter 205 is almost not etched. In some cases, the permanent supporter 205 may be made of silicon nitride, and the temporary supporter 204c may be made of polysilicon, so that the temporary supporter 204c is etched, while the permanent supporter 205 is almost not etched. Almost no etching of the permanent supporter 205 will result in almost no reduction of the mechanical strength of the permanent supporter 205.

The permanent supporters 205 are formed which cover the top surfaces 106a of the bottom electrodes 106 and the temporary supporters 204c, while the temporary supporters 204c mechanically support the bottom electrodes 106. The temporary supporters 204c mechanically supporting the bottom, electrodes 106 allows the permanent supporters 205 to have an increased thickness, thereby increasing the mechanical strength of the permanent supporters 205.

The permanent supporters 205 cover the top surfaces 106a of the bottom electrodes 106. The permanent supporters 205 do not cover the inside and outside surfaces of the bottom electrodes 106, so as to allow the stack of the capacitive insulating film 206 and the top electrode 207 to extend along the inside and outside faces of the side wall portion, of the bottom electrodes 106. The inside and outside faces of the side wall portion of the bottom-closed cylinder-shaped bottom electrode 106 can be used to form the capacitor. Use of the inside and outside faces of the side wall portion of the bottom-closed cylinder-shaped bottom electrode 106 is larger in capacitance by about two times than use of the inside face only of the side wall portion of the bottom-closed cylinder-shaped bottom electrode as long as the capacitors have substantially the same dimensions. Use of the inside and outside faces of the side wall portion of the bottom-closed cylinder-shaped bottom electrode 106 is effective to ensure increased capacitance without increasing the dimensions of the capacitor.

Second Embodiment

A second embodiment of the present invention will be described with reference to FIGS. 14-20.
[Process for Forming Semiconductor Device]
A process for forming a semiconductor device in accordance with a second embodiment of the present invention will be described in details with reference to FIGS. 14-20. The process for forming the semiconductor device may include, but is not limited to, a stacking process, a through-hole formation process, a bottom electrode formation process, a temporary supporter formation process, an insulating film etching process, a permanent supporter formation process, a temporary supporter removal process, and a capacitor formation process.

In this second embodiment, the hard mask and the temporary supporter to be formed from the hard mask may be made of amorphous carbon instead of polysilicon.
(Stacking Process)
With reference to FIG. 14, a first inter-layer insulator 101 having capacitive contact plugs 100 that are buried in the first inter-layer insulator 101 has been prepared, before the stacking process will be initiated. An etching stopper film 102 is formed over the first, inter-layer insulator 101 and the capacitive contact plugs 100. A second inter-layer insulator 103 for bottom electrode formation is formed over the etching stopper film 102. An insulating film 304 for temporary supporter formation is formed over the second inter-layer insulator 103. The insulating film 304 for temporary supporter formation is made of a material that is different from the material of the second inter-layer insulator 103.

In more detail, a semiconductor substrate is prepared. The semiconductor substrate is not illustrated in FIG. 14. Semiconductor devices such as MOS transistors are formed over the semiconductor substrate. Bit lines are formed over the semiconductor substrate. The bit lines are connected to the MOS transistors. The MOS transistors and the bit lines are not illustrated in FIG. 14. A first inter-layer insulator 101 is formed which covers the MOS transistors and the bit lines over the semiconductor substrate. In some cases, the first inter-layer insulator 101 may be made of, but is not limited to, silicon oxide. Capacitive contact plugs 100 are formed in the first inter-layer insulator 101. The capacitive contact plugs 100 may be used to connect the MOS transistors over the semiconductor substrate and the bottom electrodes of the capacitors. In some cases, the capacitive contact plugs 100 may be made of, but is not limited to, polysilicon or metals such as tungsten.

Figure 14:
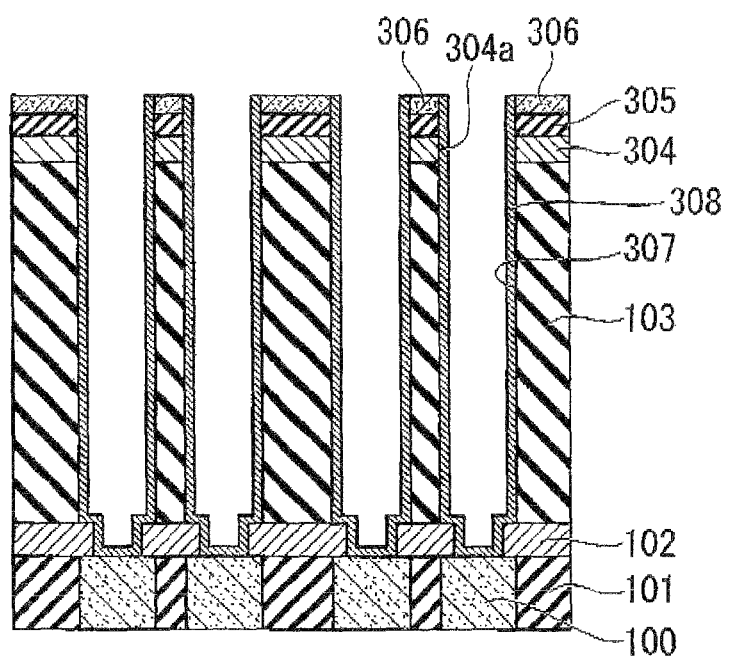
FIG. 14 is a fragmentary cross sectional elevation view illustrating a semiconductor device in a step involved in a method of forming the semiconductor device in accordance with the second preferred embodiment of the present invention.

As shown in FIG. 14, an etching stopper film 102 may be formed over the first inter-layer insulator 101 and the capacitive contact plugs 100. The etching stopper film 102 may cover the first inter-layer insulator 101 and the capacitive contact plugs 100. In some cases, the etching stopper film 102 may be made of, but is not limited to, silicon nitride. A second inter-layer insulator 103 may be formed over the etching stopper film 102. The second inter-layer insulator 103 may cover the etching stopper film 102. In some cases, the second inter-layer insulator 103 may be made of, but is not limited to, silicon oxide. An insulating film 304 for temporary supporter formation may be formed over the second inter-layer insulator 103. The insulating film 304 for temporary supporter formation may cover the second inter-layer insulator 103. In some cases, the insulating film 304 for temporary supporter formation may be made of a material that is different from the material of the second inter-layer insulator 103. In some cases, the insulating film 304 for temporary supporter formation may be made of but is not limited to, amorphous carbon. Further, a passivation silicon oxide film 305 may be formed over the insulating film 304 of amorphous carbon. The passivation silicon oxide film 305 covers the insulating film 304 of amorphous carbon. A passivation silicon film 306 may be formed over the passivation silicon oxide film 305. The stack of the passivation silicon oxide film 305 and the passivation silicon oxide film 305 may cover the insulating film 304 of amorphous carbon.

The etching stopper film 102 can be used to perform as an etching stopper when etching the second inter-layer insulator 103. The second inter-layer insulator 103 can be used to form through holes therein, the through holes performing as bases for a bottom electrode of a capacitor. The insulating film 304 of amorphous carbon can be used as a hard mask for forming the through holes in the second inter-layer insulator 103. The insulating film 304 of amorphous carbon can also be used as a temporary supporter that temporary-support the bottom electrode of the capacitor. The stack of the passivation silicon oxide film 305 and the passivation silicon film 306 may perform as a passivation for protecting the insulating film 304 of amorphous carbon.

The insulating film 304 of amorphous carbon may be formed by any available method. Typical examples of the method that can be used for forming the insulating film 304 of amorphous carbon, may include, but is not limited to, a plasma chemical vapor deposition using a hydrocarbon gas and a physical vapor deposition such as sputtering. The passivation silicon oxide film 305 and the passivation silicon film 306 may be formed by any available method. Typical examples of the method that can be used for forming the passivation silicon oxide film 305 or the passivation silicon film 306 may include, but is not limited to, a plasma chemical vapor deposition and a thermal chemical vapor deposition.

When the capacitor is used as a capacitor of a memory cell in DRAM, the thickness of the second inter-layer insulator 103 may generally be, but is not limited to, in the range of about 1 micrometer to about 2 micrometers, and the thickness of the insulating film 304 of amorphous carbon performing as the hard mask and the temporary supporter may generally be, but is not limited to, about 100 nanometers. The thickness of the passivation silicon oxide film 305 may generally be, but is not limited to, about 50 nanometers. The thickness of the passivation silicon film 306 may generally be, but is not limited to about 100 nanometers.

(Through-Hole Formation Process)

Through holes 307 are formed which penetrate the passivation silicon film 306, the passivation silicon oxide film 305, the insulating film 304 and the second inter-layer insulator 103 and reach the capacitive contact plugs 100.

As shown in FIG. 14, a resist film is applied on the passivation silicon film 306. The resist film is then patterned to form a resist pattern. The passivation silicon film 306 may be selectively etched by using the resist film as a mask. This selective removal of the passivation silicon film 306 can be realized by, but not limited to, a plasma dry etching process using the plasma of chlorine gas. The resist mask as used is then removed while the passivation silicon oxide film 305 protects the insulating film 304 of amorphous carbon. Removal of the resist mask can be realized by, but not limited to, oxygen-ashing. The passivation silicon oxide film 305, the insulating film 304 and the second inter-layer insulator 103 are etched by a continuing set of etching processes by using the passivation silicon film 306 as a mask, thereby forming through holes 307 which penetrate the passivation silicon film 306, the passivation silicon oxide film 305, the insulating film 304 and the second inter-layer insulator 103 and reach the capacitive contact plugs 100. In some cases, the passivation silicon oxide film 305 can selectively be etched by, but not limited to, a plasma etching process using a heavy fluorocarbon gas such as $C_5F_8$. In some cases, the insulating film 304 can selectively be etched by, but not limited to, a plasma etching process using an oxygen gas or an ammonium gas. In some cases, the second inter-layer insulator 103 can selectively be etched by, but not limited to, a plasma etching process using a heavy fluorocarbon gas such as $C_5F_8$. The insulating film 304 is selectively removed thereby forming a hard mask 304.

As described above, the resist mask as used may be removed by oxygen-ashing, while the passivation silicon oxide film 305 protects the insulating film 304 of amorphous carbon because the insulating film 304 of amorphous carbon is not etched by the oxygen-ashing unless the insulating film 304 of amorphous carbon is exposed to the oxygen-ashing.

The etching stopper film 102 is partially shown through the through holes 307. The etching stopper film 102 has exposed portions that are positioned directly under the through, holes 307. The etching stopper film 102 can be selectively and anisotropically etched so that the capacitive contact plugs 100 are shown, through the through holes 307. The capacitive contact plugs 100 have exposed surfaces which are shown through the through holes 307. The exposed surfaces of the capacitive contact plugs 100 are positioned directly under the through holes 307.

(Bottom Electrode Formation Process)

Bottom electrodes 308 may be formed in the through holes 307. The bottom electrodes 308 may each have a bottom-closed cylindrical shape. The bottom electrodes 308 may each extend over the bottom and side walls of the through hole 307. The bottom electrodes 308 may each extend along the side edge of the hard mask 304. The bottom electrodes 308 can be formed as follows.

As shown in FIG. 14, a first conductive film is formed, which covers the bottom and side walls of the through holes 307 and tire top surface of the hard mask 304. The first conductive film extends along the bottom and side walls of the through holes 307 and over the top surface of the hard mask 304. In some cases, the first conductive film may be made of, but is not limited to titanium nitride. The first conductive film may be selectively removed so that the top surface of the hard mask 304 is exposed, while the first conductive film resides on the bottom and side walls of the through holes 307 thereby forming bottom electrodes 308 in the through holes 307. The bottom electrodes 308 in the through holes 307 are separate from each other. Each bottom electrode 308 extends over the bottom wall and along the side wall of the through hole 307. Selective removal of the first conductive film from the top surface of the hard mask 304 can be realized by, but not limited to, an etching process or a chemical mechanical polishing process. The bottom wall of the through hole 307 is constituted by the exposed surface of the capacitive contact plug 100. The bottom electrode 308 contacts with the exposed surface of the capacitive contact plug 100. Thus, the bottom electrode 308 is connected to the capacitive contact plug 100.

In some case, the bottom electrodes 308 may be made of, but not limited to, titanium nitride, tungsten, or noble metals such as ruthenium. A tungsten film has good coverage. When the first conductive film is made of titanium nitride, it may be preferable that a photo-resist fills up the through holes 307 so as to allow the photo-resist protects the first conductive film in the through holes 307, while the first conductive film over the hard mask 304 is removed. The bottom electrodes 308 are protected by the photo-resist from suffering the damages.

The bottom electrodes 308 extend along the side edges 304a of the hard mask 304. The bottom electrodes 308 are bonded to the side edges 304a of the hard mask 304. The hard mask 304 can perform not only as the hard mask but as the temporary supporter.

(Temporary Supporter Formation Process)

Openings 304b are formed in the hard mask 304, so as to partially expose the second inter-layer insulator 103, whereby the hard mask 304 becomes the temporary supporter 304c. Namely, the temporary supporter 304c has the openings 304b through which the second inter-layer insulator 103 axe partially shown. The openings 304b and the temporary supporter 304c can be formed as follows.

Figure 15:
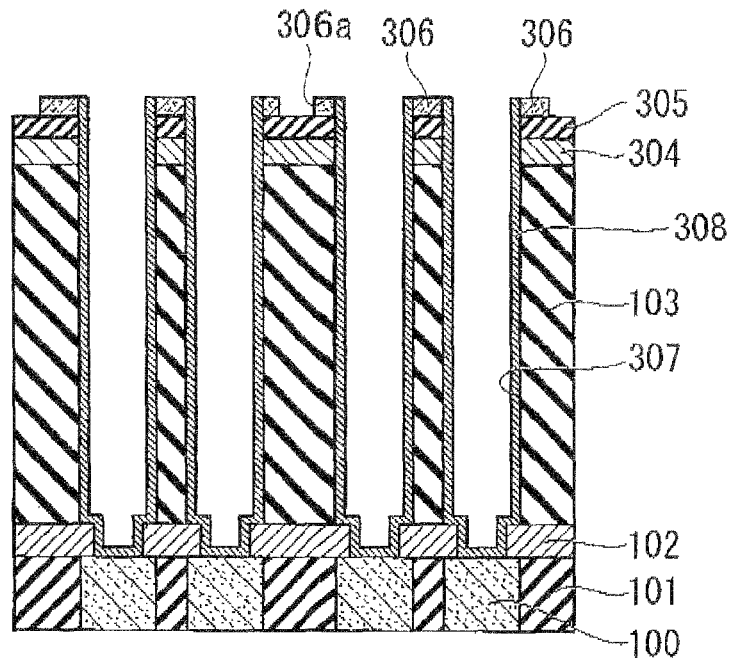
FIG. 15 is a fragmentary cross sectional elevation view illustrating a semiconductor device in a step subsequent to the step of FIG. 14, involved in the method of forming the semiconductor device in accordance with the second preferred embodiment of the present invention.

With reference to FIG. 15, a lithography process and a dry etching process may be used to form openings 306a in the passivation silicon, film 306. The resist mask as used for forming die openings 306a can be then removed by oxygen-ashing. The resist mask as used may be removed by oxygen-ashing, while the passivation silicon oxide film 305 protects the insulating film 304 of amorphous carbon because the insulating film 304 of amorphous carbon is etched by the oxygen-ashing if the insulating film 304 of amorphous carbon is exposed to the oxygen-ashing.

Figure 16:
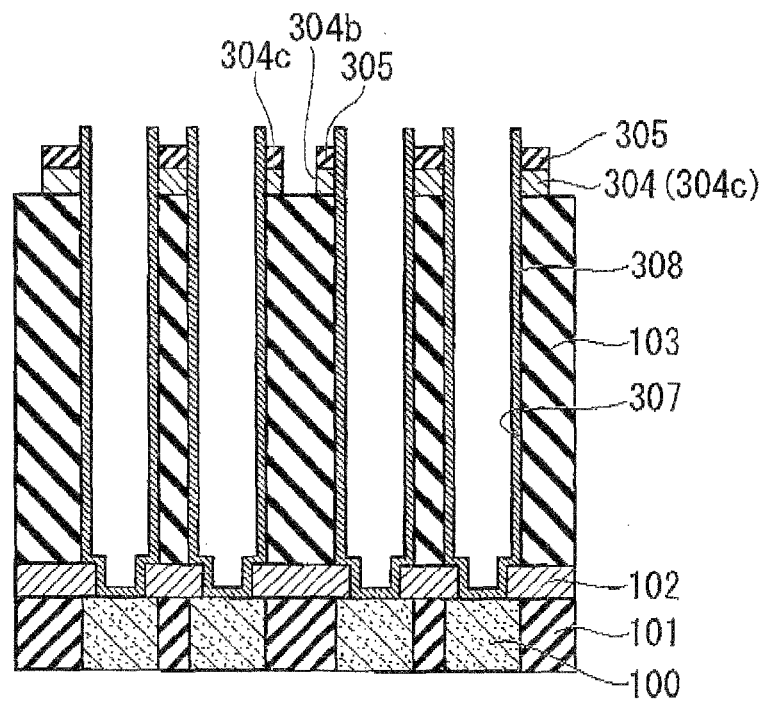
FIG. 16 is a fragmentary cross sectional elevation view illustrating a semiconductor device in a step subsequent to the step of FIG. 15, involved in the method of forming the semiconductor device in accordance with the second preferred embodiment of the present invention.

With reference to FIG. 16, openings 304b are formed in the stack of the passivation silicon oxide film 305 and the hard mask 304. The stack of the passivation silicon oxide film 305 and the hard mask 304 are selectively etched by using the passivation silicon film 306 having the openings 306a as a mask, thereby forming the openings 304b, and also thereby transforming the hard mask 304 into the temporary supporter 304c. When the hard mask 304 is made of amorphous carbon, the temporary supporter 304c is made of amorphous carbon. There is removed the resist mask that has been used for forming the openings 304b in the hard mask 304 and transforming the hard mask 304 into the temporary supporter 304c.

In some cases, the openings 304b may be realized by stripe-shape grooves which extend cross over the bottom electrodes 308 so that the openings 304b each bridge between the adjacent bottom electrodes 308, and also the openings 304b each separate the hard mask 304 into a plurality of separate stripe-shaped temporary supporters 304c. The plurality of separate stripe-shaped temporary supporters 304c may extend bridging the side portions of the openings 304b. The openings 304b may extend in generally parallel to each other. The plurality of separate stripe-shaped temporary supporters 304c may also extend in generally parallel to each other and further generally parallel to the openings 304b. A pair of the adjacent stripe-shaped temporary supporters 304c sandwiches the bottom electrode 308 at diametrically opposing ends thereof, wherein the diametrically opposing ends are diametrically distanced from each other in a width direction of the stripe-shaped temporary supporters 304c. The width direction of the stripe-shaped temporary supporters 304c is parallel to the width direction of the openings 304b. The bottom electrode 308 remains bonded to the side edge 304a of the stripe-shaped temporary supporters 304c. The bottom electrode 308 is sandwiched at diametrically opposing ends thereof by the paired adjacent stripe-shaped temporary supporters 304c. The paired adjacent stripe-shaped temporary supporters 304c can prevent the bottom electrode 308 from being collapsed, thereby preventing any formation of short circuit between the adjacent bottom electrodes 308.

The extension direction in which the stripe-shaped temporary supporters 304c and the stripe-shaped openings 304b extend may be optional as long as the extension direction is horizontal or parallel to the surface of the substrate. The extension direction may be modified.

As modifications, the openings 304b of the temporary supporters 304c may be realized by island-shape holes which each cover a plurality of bottom electrodes 308, so that the plurality of bottom electrodes 308 are supported by the temporary supporters 304c. The peripheral edges of the island-shape hole are positioned near the plurality of bottom electrodes 308 so as to allow the plurality of bottom electrodes 308 to be supported by the temporary supporters 304c. For example, the peripheral edges of each island-shape opening surrounds in plan view a group of bottom electrodes 308 that are disposed adjacently to each other so that the grouped bottom electrodes 308 that are disposed adjacently to each other are supported by the temporary supporters 304c. The shape of the openings of the temporary supporters 304c may be optional as long as the peripheral edges of the openings run near the plurality of bottom electrodes 308 so as to allow the plurality of bottom electrodes 308 to be supported by the temporary supporters 304c.

(Insulating Film Etching Process)

The second inter-layer insulator 103 and the passivation silicon oxide film 305 may be removed, while the bottom electrodes 308 are mechanically supported by the temporary supporters 304c and are connected to each other via the temporary supporters 304c. Removal of the second inter-layer insulator 103 can be realized by, but not limited to a wet etching process which exposes the second inter-layer insulator 103 to an etchant through the stripe-shaped openings 304b.

Figure 17:
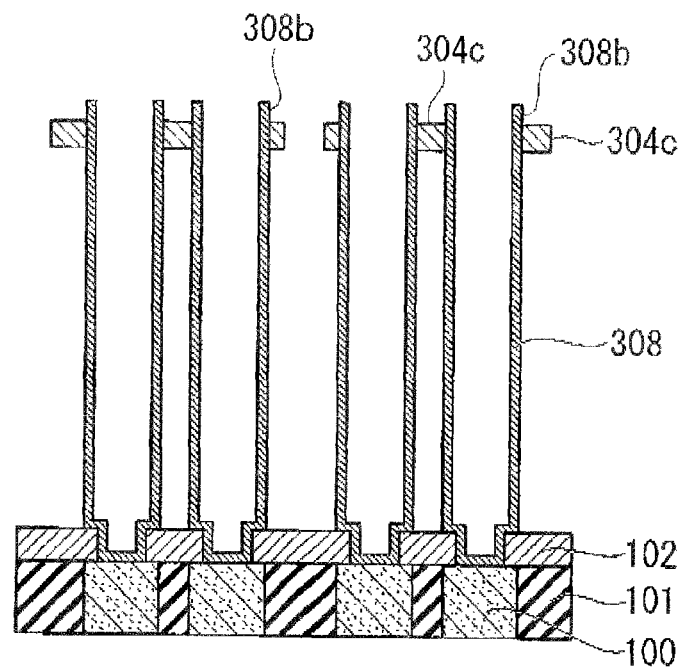
FIG. 17 is a fragmentary cross sectional elevation view illustrating a semiconductor device in a step subsequent to the step of FIG. 16, involved in the method of forming the semiconductor device in accordance with the second preferred embodiment of the present invention.

With reference to FIG. 17, the wet etching process can be carried out, but not limited to, exposing the second inter-layer insulator 103 and the passivation silicon oxide film 305 through the stripe-shaped openings 304b to an etchant such as a concentrated hydrofluoric acid of about 50% concentration at the ordinary temperature, thereby removing the second inter-layer insulator 103 of silicon oxide and the passivation silicon oxide film 305. The stripe-shaped temporary supporters 304c of amorphous carbon are not etched by the etchant. The etchant is flown through the stripe-shaped openings 304b into the second inter-layer insulator 103 of silicon oxide and the passivation silicon oxide film 305, thereby etching the second, inter-layer insulator 103 and the passivation silicon oxide film 305. The etching stopper film 102 performs as the etching stopper to the wet etching process. The wet etching process is stopped by the etching stopper film 102. After the second inter-layer insulator 103 of silicon oxide and the passivation silicon oxide film 305 are removed, an array of the bottom electrodes 308 of the bottom-closed cylinder shape extends vertically to the surface of the first inter-layer, insulator 101, wherein the bottom electrodes 308 are mechanically connected to each other via the temporary supporters 304c and mechanically supported by the temporary supporters 304c. The bottom electrode 308 remains bonded to the side edge 304a of the stripe-shaped temporary supporters 304c, so that the bottom electrodes 308 are mechanically connected to each other via the temporary supporters 304c and mechanically supported by the temporary supporters 304c. The wet etching process causes that the upper portion 308b of the bottom electrodes 308 project upwardly from the temporary supporters 304c. The upper portion 308b of the bottom, electrodes 308 is higher in level than the temporary supporters 304c.

(Permanent Supporter Formation Process)

Permanent supporters 309 may be formed to permanently support the bottom electrodes 308. The permanent supporters 309 mechanically support the bottom electrodes 308 in later processes until, the manufacturing process for the semiconductor device is completed. The permanent supporters 309 will reside in the semiconductor device so that the permanent supporters 309 mechanically support the bottom electrodes 308 after the manufacturing process for the semiconductor device is completed. In some cases, the permanent supporters 309 may be made of, but is not limited to, a material that is different from the material of the temporary supporters 304c.

The permanent supporters 309 may be formed over the temporary supporters 304c and the top surfaces 308a of the bottom electrodes 308 as well as on the outside face of the upper portion 308b of the bottom electrodes 308. The permanent supporters 309 may cover the upper surface of the temporary supporters 304c and the top surfaces 308a of the bottom electrodes 308 as well as the outside face of the upper portion 308b of the bottom electrodes 308. The permanent supporters 309 may be made of an insulating material. The permanent supporters 309 can be formed by, but not limited to, a plasma chemical vapor deposition. The permanent supporters 309 may each have varying width in the thickness direction. The permanent supporters 309 may each increase in width as its position or level becomes higher.

Figure 18:
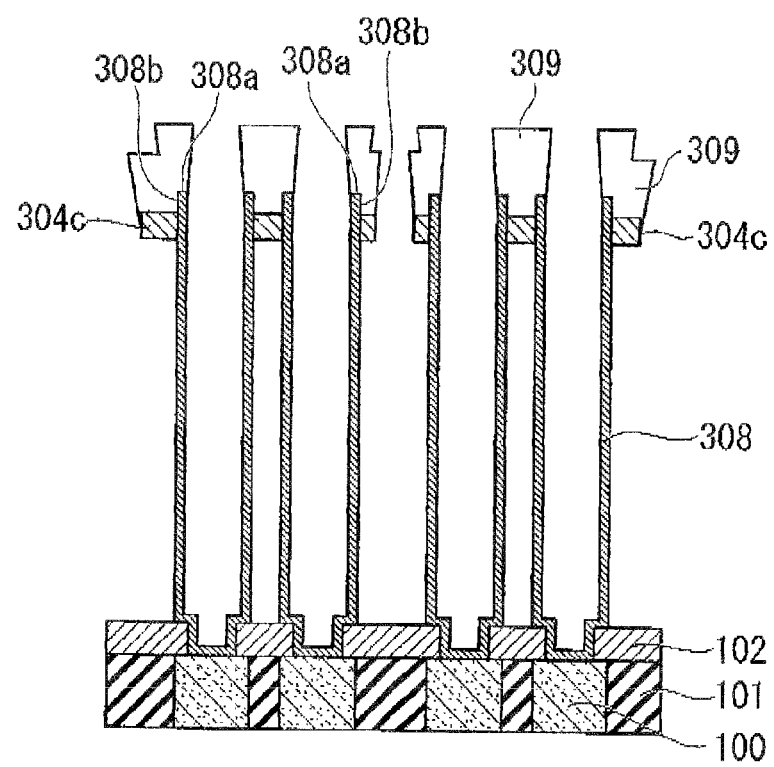
FIG. 18 is a fragmentary cross sectional elevation view illustrating a semiconductor device in a step subsequent to the step of FIG. 17, involved in the method of forming the semiconductor device in accordance with the second preferred embodiment of the present invention.

With reference to FIG. 18, an insulating film is deposited over the temporary supporters 304c and the top surfaces 308a of the bottom electrodes 308 as well as on the outside face of the upper portion 308b of the bottom electrodes 308, thereby forming a plurality of separate stripe-shaped permanent supporters 309 over the sets of the temporary supporters 304c and the top surfaces 308a of the bottom electrodes 308 as shown in FIG. 18. The stripe-shaped permanent supporters 309 may each have a stripe shape in plan view. The stripe-shaped permanent supporters 309 may be disposed to be generally parallel to each other. The two adjacent stripe-shaped permanent supporters 309 may be separated from each other by a stripe-shaped opening. Each stripe-shaped opening extends between the two adjacent stripe-shaped permanent supporters 309. Each stripe-shaped opening separates the two adjacent stripe-shaped temporary supporters 304c. Each stripe-shaped opening separates the two adjacent stripe-shaped permanent supporters 309. The stripe-shaped openings separating the two adjacent stripe-shaped temporary supporters 304c communicate with the stripe-shaped openings separating the two adjacent stripe-shaped permanent supporters 309. The stripe-shaped openings separating the two adjacent stripe-shaped permanent supporters 309 are positioned directly over the stripe-shaped openings separating the two adjacent stripe-shaped temporary supporters 304c.

The stripe-shaped permanent supporters 309 each have a lower face that is bonded to the top surface 308a of the bottom electrodes 308 as well as to the outside face of the upper portion, 308b of the bottom electrodes 308, so that the bottom electrodes 308 are mechanically supported by a pair of the two adjacent stripe-shaped permanent supporters 309. The bottom electrodes 308 are aligned in tire direction parallel to the extension direction of the stripe shaped permanent supporters 309. The stripe-shaped permanent supporters 309 mechanically supporting the bottom electrodes 308 can prevent tire bottom electrodes 308 from being collapsed, thereby preventing formation of short circuit between the adjacent bottom electrodes 308.

The extension direction in which the stripe-shaped permanent supporters 309 and the stripe-shaped openings extend may be optional as long as the extension direction is horizontal or parallel to the surface of the substrate.

The permanent supporters 309 may preferably be made of a different material, from the material of the temporary supporter 304c. In some cases, the permanent supporters 309 may be made of, but is not limited to, silicon oxide or silicon nitride, while the temporary supporter 304c is made of amorphous carbon. The silicon oxide film or the silicon nitride film has a lower etching rate to an etchant than the etching rate of the amorphous carbon film. When the permanent supporters 309 are made of silicon oxide or silicon nitride and the temporary supporter 304c is made of amorphous carbon, it is possible that the temporary supporter 304c will be etched by the wet etching process, while the permanent supporters 309 will not etched by the wet etching process.

The permanent supporters 309 of silicon oxide can be formed in the same processes as described in the first embodiment. The permanent supporters 309 of silicon nitride can also be formed in the same processes as described in the first embodiment.

As modifications, the shape of the permanent supporters 309 may be optional as long as the permanent supporters 309 extend near a plurality of bottom electrodes 308 so as to allow the plurality of bottom electrodes 308 to be supported by the permanent supporters 309. The permanent supporter 309 may be realized by a permanent support layer that has a plurality of island-shape openings, provided that the permanent supporter 309 covers the plurality of bottom electrodes 308, so that the plurality of bottom electrodes 308 are supported by the permanent supporter 309. The peripheral edges of the island-shape opening are positioned near the plurality of bottom electrodes 308 so as to allow the permanent supporter 309 to connect and support the plurality of bottom electrodes 308.

(Temporary Supporter Removal Process)

The temporary supporters 304c are removed, while the permanent supporters 309 remain to mechanically support the bottom electrodes 308. Removal of the temporary supporters 304c can be realized by, but not limited to, carrying out an etching process.

Figure 19:
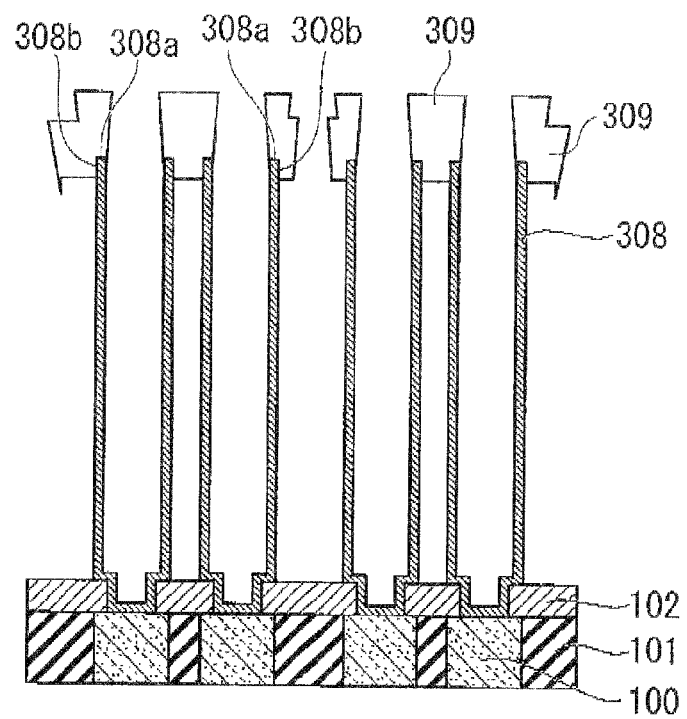
FIG. 19 is a fragmentary cross sectional elevation view illustrating a semiconductor device in a step subsequent to the step of FIG. 18, involved in the method of forming the semiconductor device in accordance with the second preferred embodiment of the present invention.

With reference to FIG. 19, the temporary supporters 304c can be removed a follows. A wet etching process may be carried out using an etchant. The temporary supporters 304c may be exposed to the etchant. The etchant is flown through the above-described stripe-shaped openings between the permanent supporters 309 to the temporary supporters 304c, thereby etching and removing the temporary supporters 304c. In some cases, the etchant may be, but is not limited to oxygen plasma or hydrogen-containing plasma such as ammonium. Removal of the temporary supporters 304c of amorphous carbon causes that the bottom electrodes 308 are eclectically isolated, as long as the permanent supporters 309 are made of an insulator such as silicon oxide or silicon nitride.

In some cases, the etchant may be oxygen plasma or hydrogen-containing plasma such as ammonium. The permanent supporters 309 are made of silicon oxide or silicon nitride, and the temporary supporters 304c are made of amorphous carbon. In this case, the etchant can etch the temporary supporters 304c of amorphous carbon at high etching rate, while the etchant will almost not etch the bottom electrodes 308 and the permanent supporters 309.

Removal of the temporary supporters 304c results in that the permanent supporters 309 are disposed in parallel to each other and distanced from each other by the stripe-shaped openings. The permanent supporters 309 have faces that are bonded to the top surfaces 308a of the bottom electrodes 308 and to the outside face of the upper portion 308b of the bottom electrodes 308. A plurality of the aligned bottom electrodes 308 is mechanically supported by the pair of two adjacent stripe-shaped permanent supporters 309. The aligned bottom electrodes 308 are mechanically connected to each other by the pair of two adjacent stripe-shaped permanent supporters 309. The aligned bottom electrodes 308 are electrically isolated from each other as long as the permanent supporters 309 are made of an insulator.

(Capacitor Formation Process)

Capacitors 313 are formed in the through holes 307. A capacitive insulating film 310 is formed on the exposed surfaces of the bottom electrodes 308. A top electrode 311 is formed on the capacitive insulating film 310. The top electrode 311 is separated from the bottom electrodes 309 by the capacitive insulating film 310. The capacitors 313 each include the bottom electrodes 308, the capacitive insulating film 310, and the top electrode 311.

Figure 20:
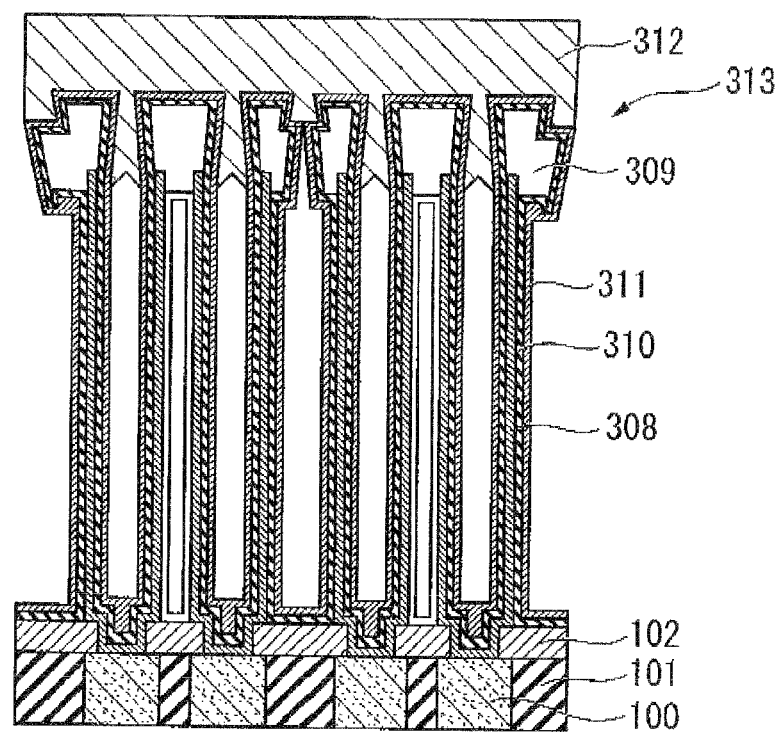
FIG. 20 is a fragmentary cross sectional elevation view illustrating a semiconductor device in a step subsequent to the step of FIG. 19, involved in the method of forming the semiconductor device in accordance with the second preferred embodiment of the present invention.

With reference to FIG. 20, a capacitive insulating film 310 is formed on the surfaces of the permanent supporters 309 and on the entirety of the exposed surfaces of the bottom electrodes 308 of bottom-closed cylinder shape. The capacitive insulating film 310 covers the surfaces of the permanent supporters 309 and the entirety of the exposed surfaces of the bottom electrodes 308 of bottom-closed cylinder shape. The top electrode 311 is formed on the capacitive insulating film 310. The stack of the capacitive insulating film 310 and the top electrode 311 is formed on the surfaces of the permanent supporters 309 and on the entirety of the exposed surfaces of the bottom electrodes 308 of bottom-closed cylinder shape. The stack of the capacitive insulating film 310 and the top electrode 311 covers the surfaces of the permanent supporters 309 and the entirety of the exposed surfaces of the bottom electrodes 308 of bottom-closed cylinder shape.

The bottom electrodes 308 and the permanent supporters 310 are together covered by the stack of the capacitive insulating film 310 and the top electrode 311, thereby ensuring that the bottom electrodes 308 are bonded to the permanent supporters 309.

The stack of the capacitive insulating film 310 and the top electrode 311 extend both the inside and outside faces of the side wall portion of the bottom-closed cylinder-shaped bottom electrode 308. The inside and outside faces of the side wall portion of the bottom-closed cylinder-shaped bottom electrode 308 can be used to form the capacitor. Use of the inside and outside faces of the side wall portion of the bottom-closed cylinder-shaped bottom electrode 308 is larger in capacitance by about two times than, use of the inside face only of the side wall portion of the bottom-closed cylinder-shaped bottom electrode as long as the capacitors have substantially the same dimensions. Use of the inside and outside faces of the side wall portion of the bottom-closed cylinder-shaped bottom electrode 308 is effective to ensure increased capacitance without increasing the dimensions of the capacitor.

A common electrode 312 is formed over the top electrode 311.

In some cases, the capacitive insulating film 310 may be realized by, but not limited to, a single-layered structure of insulator or multi-layered structure of insulator. Typical examples of the single-layered structure of insulator for the capacitive insulating film 310 may include, but are not limited to, an aluminum oxide film, a hafnium oxide film, a zirconium oxide film, and a tantalum oxide film. Typical examples of the multi-layered structure of insulator may include, but are not limited to, any stack of two or more films such as an aluminum oxide film, a hafnium oxide film, a zirconium oxide film, and a tantalum oxide film. The capacitive insulating film 310 may be formed by, but not limited to, an atomic layer deposition (ALD) method. The top electrode 311 may preferably be made of a conductive material having good coverage. The common electrode 312 may preferably be made of a different conductive material having a lower resistance than the conductive material of the top electrode 311. In some cases, the top electrode 311 may be made of, but not limited to, titanium nitride, and the common electrode 312 may be made of, but not limited to, tungsten. The crown capacitors 313 are formed, which each include the bottom electrodes 308, the capacitive insulating film 310, and the top electrode 311. The common electrode 312 is disposed over the capacitors 313.

The crown capacitors 313 utilize the inside and outside faces of the side wall portion of the bottom-closed cylinder-shaped bottom electrode 308. Namely, the inside and outside faces of the side wall portion of the bottom-closed cylinder-shaped bottom electrode 308 can be used to form the capacitor. Use of the inside and outside faces of the side wall portion of the bottom-closed cylinder-shaped bottom electrode 308 is larger in capacitance by about two times than use of the inside face only of the side wall portion of the bottom-closed cylinder-shaped bottom electrode as long as the capacitors have substantially the same dimensions. Use of the inside and outside faces of the side wall portion of the bottom-closed cylinder-shaped bottom electrode 308 is effective to ensure increased capacitance without increasing the dimensions of the capacitor.

The capacitor 313 may include the bottom electrode 308, the capacitive insulating film 310, and the top electrode 311. The bottom electrodes 308 are formed in the through holes 307 in the inter-layer insulator 103. The inter-layer insulator 103 extends over the first inter-layer insulator 101. The first inter-layer insulator 101 has the capacitive contact plugs 100. The bottom electrodes 308 contact the capacitive contact plugs 100. The bottom electrode 308 has the bottom-closed cylinder-shape. The permanent supporters 309 are formed over the top surfaces 308a of the bottom electrodes 308 and adjacent to the outside face of the upper portion 308b of the bottom electrodes 308. The permanent supporters 309 have faces that are bonded to the top surfaces 308a of the bottom electrodes 308 and to the outside face of the upper portion 308b of the bottom electrodes 308. The stack of the capacitive insulating film 310 and the top electrode 311 extend both, the inside and outside faces of the side wall portion of the bottom-closed cylinder-shaped bottom electrode 308.

The materials for the inter-layer insulator 103 and the temporary supporter 304c are different from each other, so as to allow a wet etching process to be carried out using an etchant so that the wet etching rate of the inter-layer insulator 103 is much greater than the wet etching rate of the temporary supporter 304c. Namely, the inter-layer insulator 103 is etched, while the temporary supporter 304c is almost not etched. In some cases, the inter-layer insulator 103 may be made of silicon oxide, and the temporary supporter 304c may be made of amorphous carbon, so that the inter-layer insulator 103 is etched, while the temporary supporter 304c is almost not etched. Almost no etching of the temporary supporter 304c will result in almost no reduction of the mechanical strength of the temporary supporter 304c.

The permanent supporters 309 may be made of a material that is different from the material for the temporary support 304c, so as to allow an ashing process to be carried out using oxygen, plasma or hydrogen plasma, so that the wet etching rate of the temporary support 304c is much greater than the wet etching rate of the permanent supporters 309. Namely, the temporary support 304c is etched, while the permanent supporter 309 is almost not etched. In some cases, the permanent supporter 309 may be made of silicon nitride, and the temporary support 304c may be made of polysilicon, so that the temporary support 304c is etched, while the permanent supporter 309 is almost not etched. Almost no etching of the permanent supporter 309 will result in almost no reduction of the mechanical strength of the permanent supporter 309.

As described above, the resist mask as used to form the through-holes 307 and the openings 305 may be removed by oxygen-ashing, while the passivation silicon oxide film 305 protects the insulating film 304 of amorphous carbon because the insulating film 304 of amorphous carbon is not etched by the oxygen-ashing unless the insulating film 304 of amorphous carbon is exposed to the oxygen-ashing. The passivation silicon oxide film 305 protecting the insulating film 304 of amorphous carbon will prevent any reduction in mechanical strength of the temporary supporter 304c.

The permanent supporters 309 have faces that are bonded not only to the top surfaces 308a of the bottom electrodes 308 but also to the outside face of the upper portion 308b of the bottom electrodes 308. Namely, the permanent supporters 309 are bonded with an increased bonding area to the bottom electrodes 308, thereby increasing the bonding strength between the permanent supporters 309 and the bottom electrodes 308. The increased bonding area between the permanent supporters 309 and the bottom electrodes 308 can ensure preventing the bottom electrodes 308 from being released from the permanent supporters 309.

The permanent supporters 309 are formed which cover the top surfaces 308a of the bottom electrodes 308 and the temporary supporters 304c, while the temporary supporters 304c mechanically support the bottom electrodes 308. The temporary supporters 304c mechanically supporting the bottom electrodes 308 allows the permanent supporters 309 to have an increased thickness, thereby increasing the mechanical strength of the permanent supporters 309.

The permanent supporters 309 cover the top surfaces 308a of the bottom electrodes 308. The permanent supporters 309 do not cover the inside and outside surfaces of the bottom electrodes 308, so as to allow the stack of the capacitive insulating film 310 and the top electrode 311 to extend along the inside and outside faces of the side wall portion of the bottom electrodes 308. The inside and outside faces of the side wall portion of the bottom-closed cylinder-shaped bottom electrode 308 can be used to form the capacitor. Use of the inside, and outside faces of the side wall portion of the bottom-closed cylinder-shaped bottom electrode 308 is larger in capacitance by about two times than use of the inside face only of the side wall portion of the bottom-closed cylinder-shaped bottom electrode as long as the capacitors have substantially the same dimensions. Use of the inside and outside faces of the side wall portion of the bottom-closed cylinder-shaped bottom electrode 308 is effective to ensure increased capacitance without increasing the dimensions of the capacitor.

The permanent supporters 309 are formed, which each cover a pair of the temporary supporter 304c and the top surface 308a of the bottom electrode 308. The permanent supporters 309 have bottom faces that are securely bonded to the top surfaces 308a of the bottom electrodes 308. The permanent supporters 309 are unlikely to be removed from the bottom electrodes 308. The stripe-shaped permanent supporters 309 mechanically supporting the bottom electrodes 308 can prevent the bottom electrodes 308 from being collapsed, thereby preventing formation of short circuit between the adjacent bottom electrodes 308. The stripe-shaped permanent supporters 309 can also prevent paired-bits or grouped bits from defect. The bottom electrodes 308 and the permanent supporters 309 are together covered by the stack of the capacitive insulating film 310 and the top electrode 311, thereby further ensuring that the bottom electrodes 308 are bonded to the permanent supporters 309. The stack of the capacitive insulating film 310 and the top electrode 311 in combination with the permanent supporters 309 can ensure preventing the bottom electrodes 308 from being collapsed, thereby preventing formation of short circuit between the adjacent bottom electrodes 308. The stack of the capacitive insulating film 310 and the top electrode 311 in combination with the permanent supporters 309 can ensure preventing paired-bits or grouped bits from defect.

As used herein, the following directional terms "forward, rearward, above, downward, vertical, horizontal, below, and transverse" as well as any other similar directional terms refer to those directions of an apparatus equipped with the present invention. Accordingly, these terms, as utilized to describe the present invention should be interpreted relative to an apparatus equipped with the present invention.

The terms of degree such as "substantially," "about," and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

It is apparent that the present invention is not limited to the above embodiments, but may be modified and changed without departing from the scope and spirit of the invention.

What is claimed is:

1. A method of forming a semiconductor device, the method comprising:
    forming a second insulating film over a first insulating film;
    forming at least one through-hole that penetrates the first and second insulating films;
    forming at least one first electrode that extends at least along the side wall of the at least one through-hole;
    removing the first insulating film, while using the second insulating film as a temporary supporter that supports the at least one first electrode;
    forming at least one permanent supporter that supports the at least one first electrode; and
    removing the second insulating film as the temporary supporter, while leaving the at least one permanent supporter to support the at least one first electrode.

2. The method as claimed in claim 1, wherein forming the at least one through-hole comprises forming a plurality of through-holes that each penetrate the first and second insulating films; and
    forming the at least one first electrode comprises forming a plurality of first electrodes on the bottom and side walls of the plurality of through-holes, so that the temporary supporter connects the plurality of first electrodes to each other and the temporary supporter supports the plurality of first electrodes.

3. The method as claimed in claim 2, further comprising:
    transforming the second insulating film into a plurality of the temporary supporters, after forming the at least one first electrode and before removing the first insulating film, and
    wherein the plurality of the temporary supporters together connect the plurality of first electrodes to each other and the plurality of the temporary supporters together support the plurality of first electrodes.

4. The method as claimed in claim 2, wherein forming the at least one permanent supporter comprises forming a plurality of permanent supporters that together connect the plurality of first electrodes to each other and the plurality of the permanent supporters together support the plurality of first electrodes; and
    the second insulating film as the temporary supporter is removed, while leaving the plurality of permanent supporters to support the plurality of first electrodes.

5. The method as claimed in claim 1, further comprising:
    transforming the second insulating film into a plurality of the temporary supporters, after forming the at least one first electrode and before removing the first insulating film, and
    wherein the plurality of the temporary supporters together support the at least one first electrode.

6. The method as claimed in claim 1, wherein forming the at least one permanent supporter comprises forming a plurality of permanent supporters that together support the at least one first electrode; and
    the second insulating film as the temporary supporter is removed, while leaving the plurality of permanent supporters to support the at least one first electrode.

7. The method as claimed in claim 1, wherein transforming the second insulating film comprises forming openings in the second insulating film; and
    removing the first insulating film comprises carrying out a first wet etching process that introduces a first etchant through the openings into the first insulating film, so that the first etchant etches the first insulating film.

8. The method as claimed in claim 7, wherein the first and second insulating films comprise first and second insulating materials that are different from each other, and the first insulating material is higher in etching rate to the first etchant than the second insulating material.

9. The method as claimed in claim 8, wherein the first insulating material is silicon oxide, and the second insulating material is one of a polysilicon and an amorphous carbon.

10. The method as claimed in claim 1, wherein removing the second insulating film as the temporary supporter comprises carrying out a second wet etching process that introduces a second etchant through the openings into the second insulating film as the temporary supporter, so that the second etchant etches the second insulating film as the temporary supporter.

11. The method as claimed in claim 10, wherein the second insulating film as the temporary supporter and the at least one permanent supporter comprise second and third insulating materials that are different from each other, and the second insulating material is higher in etching rate to the second etchant than the third insulating material.

12. The method as claimed in claim 11, wherein the second insulating material is one of a polysilicon and an amorphous carbon, and the third insulating material is one of silicon oxide and silicon nitride.

13. The method as claimed in claim 1, wherein forming the at least one permanent supporter comprises forming the at least one permanent supporter over the top portion of the at least one first electrode and the second insulating film as the temporary supporter.

14. The method as claimed in claim 1, further comprising:

forming a capacitive insulating film that covers both faces of the at least one first electrode and further cover the at least one permanent supporter; and forming a second electrode on the capacitive insulating film, the second electrode being separated by the capacitive insulating film from the at least one first electrode, wherein a stack of the capacitive insulating film and the second electrode together covers the both faces of the at least one first electrode and the at least one permanent supporter.

* * * * *